US008815109B2

(12) United States Patent
Swedek et al.

(10) Patent No.: US 8,815,109 B2
(45) Date of Patent: Aug. 26, 2014

(54) SPECTRA BASED ENDPOINTING FOR CHEMICAL MECHANICAL POLISHING

(75) Inventors: Boguslaw A. Swedek, Cupertino, CA (US); Dominic J. Benvegnu, La Honda, CA (US); Jeffrey Drue David, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/339,057

(22) Filed: Dec. 28, 2011

(65) Prior Publication Data
US 2012/0100642 A1 Apr. 26, 2012

Related U.S. Application Data

(60) Continuation of application No. 12/182,076, filed on Jul. 29, 2008, now Pat. No. 8,088,298, which is a division of application No. 11/261,742, filed on Oct. 28, 2005, now Pat. No. 7,406,394, which is a continuation-in-part of application No. 11/213,344, filed on Aug. 26, 2005, now Pat. No. 7,764,377.

(60) Provisional application No. 60/710,682, filed on Aug. 22, 2005.

(51) Int. Cl.
*C03C 15/00* (2006.01)
(52) U.S. Cl.
USPC ............... 216/84; 216/85; 438/689; 438/690
(58) Field of Classification Search
USPC .............................. 216/84, 85; 438/689, 690
See application file for complete search history.

(56) References Cited

U.S. PATENT DOCUMENTS

| 5,365,340 A | 11/1994 | Ledger |
| 5,595,526 A | 1/1997 | Yau et al. |
| 5,747,380 A | 5/1998 | Yu et al. |

(Continued)

FOREIGN PATENT DOCUMENTS

| EP | 1176631 | 1/2002 |
| JP | 2000-183001 | 6/2000 |

(Continued)

OTHER PUBLICATIONS

Annex to Form PCT/ISA/206, Communication Relating to the Results of the Partial International Search, International Application No. PCT/US2006/032659, Feb. 6, 2007, 3 pp.

(Continued)

*Primary Examiner* — Lan Vinh
*Assistant Examiner* — Maki Angadi
(74) *Attorney, Agent, or Firm* — Fish & Richardson P.C.

(57) ABSTRACT

A computer implemented method of monitoring a polishing process includes, for each sweep of a plurality of sweeps of an optical sensor across a substrate undergoing polishing, obtaining a plurality of current spectra, each current spectrum of the plurality of current spectra being a spectrum resulting from reflection of white light from the substrate, for each sweep of the plurality of sweeps, determining a difference between each current spectrum and each reference spectrum of a plurality of reference spectra to generate a plurality of differences, for each sweep of the plurality of sweeps, determining a smallest difference of the plurality of differences, thus generating a sequence of smallest difference, and determining a polishing endpoint based on the sequence of smallest differences.

17 Claims, 17 Drawing Sheets

(56) References Cited

U.S. PATENT DOCUMENTS

| | | |
|---|---|---|
| 5,893,796 A | 4/1999 | Birang et al. |
| 6,153,116 A * | 11/2000 | Yang et al. ............... 216/85 |
| 6,172,756 B1 | 1/2001 | Chalmers et al. |
| 6,184,985 B1 | 2/2001 | Chalmers et al. |
| 6,190,234 B1 | 2/2001 | Swedek et al. |
| 6,204,922 B1 | 3/2001 | Chalmers |
| 6,271,047 B1 | 8/2001 | Ushio et al. |
| 6,296,548 B1 | 10/2001 | Wiswesser et al. |
| 6,358,327 B1 | 3/2002 | Pokhama et al. |
| 6,361,646 B1 | 3/2002 | Bibby, Jr. et al. |
| 6,489,624 B1 | 12/2002 | Ushio et al. |
| 6,511,363 B2 | 1/2003 | Yamane et al. |
| 6,618,130 B2 | 9/2003 | Chen |
| 6,623,991 B2 | 9/2003 | Johnson et al. |
| 6,645,045 B2 | 11/2003 | Ohkawa |
| 6,664,557 B1 | 12/2003 | Amartur |
| 6,670,200 B2 | 12/2003 | Ushio et al. |
| 6,676,482 B2 | 1/2004 | Bibby, Jr. et al. |
| 6,678,046 B2 | 1/2004 | Opsal |
| 6,678,055 B2 | 1/2004 | Du-Nour et al. |
| 6,762,838 B2 | 7/2004 | Du-Nour |
| 6,768,967 B2 | 7/2004 | Johnson et al. |
| 6,801,321 B1 | 10/2004 | Du-Nour |
| 6,806,105 B2 | 10/2004 | Johnson et al. |
| 6,806,948 B2 | 10/2004 | Katz et al. |
| 6,813,034 B2 | 11/2004 | Rosencwaig et al. |
| 6,819,426 B2 | 11/2004 | Sezginer et al. |
| 6,836,328 B2 | 12/2004 | Opsal |
| 6,842,259 B2 | 1/2005 | Rosencwaig et al. |
| 6,885,467 B2 * | 4/2005 | Du-Nour et al. ............... 356/630 |
| 6,898,596 B2 | 5/2005 | Aikens et al. |
| 6,908,374 B2 | 6/2005 | Wang et al. |
| 6,947,135 B2 | 9/2005 | Johnson |
| 6,969,619 B1 * | 11/2005 | Winniczek ............... 438/9 |
| 6,995,842 B2 | 2/2006 | Opsal |
| 7,015,218 B1 | 3/2006 | Ushio et al. |
| 7,042,581 B2 | 5/2006 | Schietinger et al. |
| 7,097,537 B1 | 8/2006 | David et al. |
| 7,255,771 B2 | 8/2007 | Chen et al. |
| 7,406,394 B2 | 7/2008 | Swedek et al. |
| 7,409,260 B2 | 8/2008 | David et al. |
| 7,764,377 B2 | 7/2010 | Benvegnu et al. |
| 2001/0039064 A1 | 11/2001 | Ushio et al. |
| 2002/0013007 A1 | 1/2002 | Hasegawa et al. |
| 2002/0030826 A1 | 3/2002 | Chalmers et al. |
| 2002/0115380 A1 | 8/2002 | Yamane et al. |
| 2002/0127951 A1 | 9/2002 | Ishikawa et al. |
| 2002/0155789 A1 * | 10/2002 | Bibby et al. ............... 451/6 |
| 2002/0173225 A1 | 11/2002 | Wang et al. |
| 2003/0002032 A1 | 1/2003 | DuNour |
| 2003/0022400 A1 | 1/2003 | Nomoto et al. |
| 2003/0053042 A1 * | 3/2003 | Chen ............... 356/73 |
| 2003/0098704 A1 | 5/2003 | DuNour et al. |
| 2003/0153246 A1 | 8/2003 | Desai et al. |
| 2003/0184732 A1 | 10/2003 | Katz et al. |
| 2003/0205664 A1 | 11/2003 | Abe et al. |
| 2004/0080761 A1 | 4/2004 | Du-Nour et al. |
| 2004/0085539 A1 | 5/2004 | Opsal |
| 2005/0026542 A1 | 2/2005 | Battal et al. |
| 2005/0105089 A1 | 5/2005 | Opsal |
| 2005/0117164 A1 | 6/2005 | Nomoto et al. |
| 2006/0020419 A1 | 1/2006 | Benvegnu |
| 2006/0274326 A1 | 12/2006 | Kobayashi et al. |
| 2007/0039925 A1 | 2/2007 | Swedek et al. |
| 2007/0042675 A1 | 2/2007 | Benvegnu et al. |
| 2007/0224915 A1 | 9/2007 | David et al. |

FOREIGN PATENT DOCUMENTS

| | | |
|---|---|---|
| JP | 2000-310512 | 11/2000 |
| JP | 2001-287159 | 10/2001 |
| JP | 2002-009030 | 1/2002 |
| JP | 2002-359217 | 12/2002 |
| JP | 2004-165473 | 6/2004 |
| JP | 2005-159203 | 6/2005 |
| TW | 541233 | 7/2003 |
| WO | WO 00/54935 | 9/2000 |
| WO | WO 01/72470 | 10/2001 |
| WO | WO 2004/035265 | 4/2004 |

OTHER PUBLICATIONS

International Search Report and Written Opinion of the International Searching Authority, International Application Serial No. PCT/US2006/032659, May 16, 2007, 17 pp.

Chinese Office Action in Application Serial No. 200680030404.9 mailed Jul. 8, 2011, 7 pages.

* cited by examiner

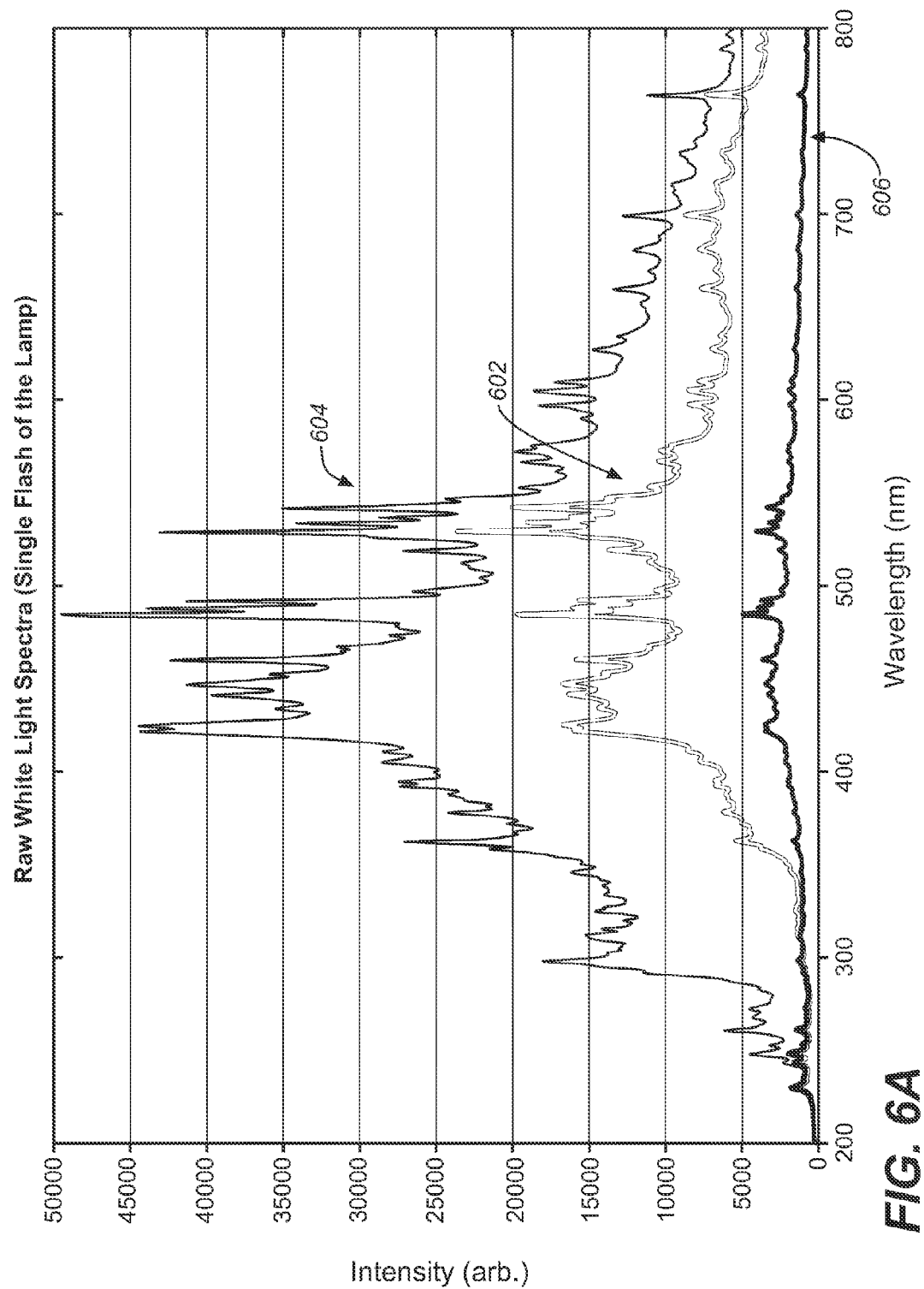

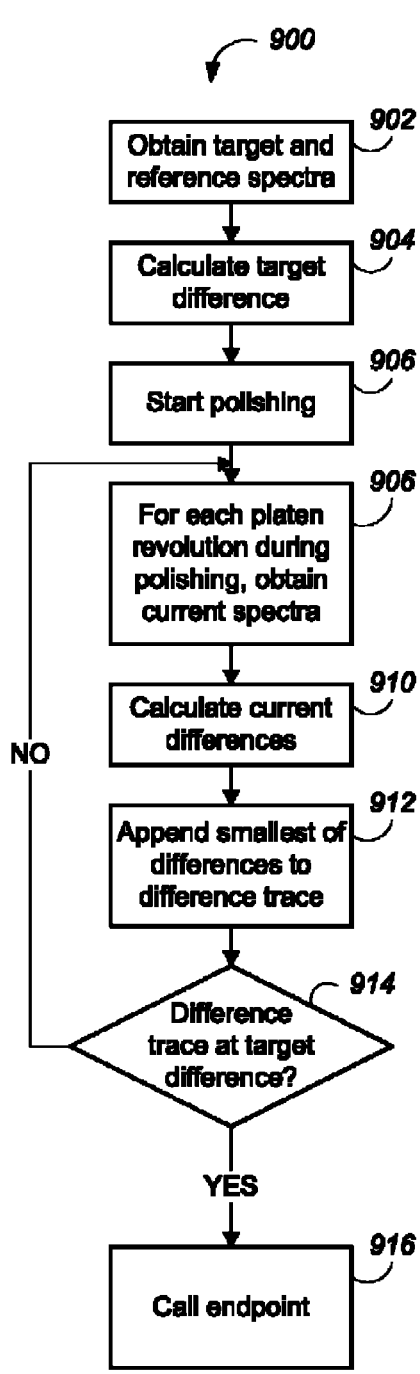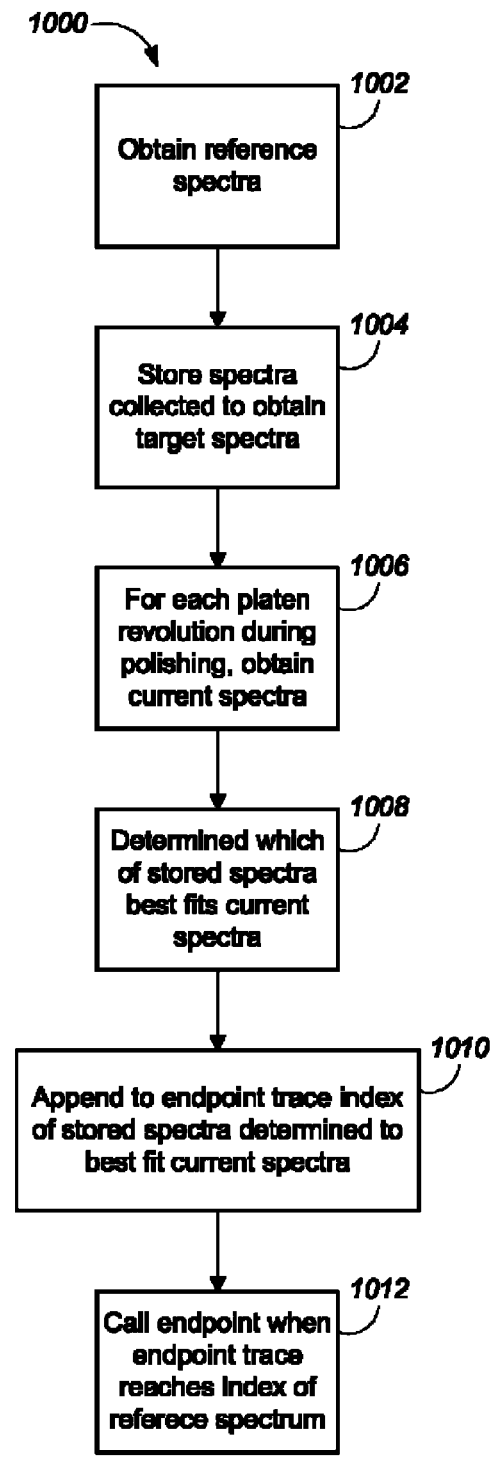
FIG. 9A                    FIG. 10A

SPECTRA BASED ENDPOINTING FOR CHEMICAL MECHANICAL POLISHING

CROSS-REFERENCE TO RELATED APPLICATIONS

This application is a continuation of U.S. patent application Ser. No. 12/182,076, filed Jul. 29, 2008, which will issue as U.S. Pat. No. 8,088,298, which is a divisional of U.S. patent application Ser. No. 11/261,742, filed Oct. 28, 2005, now U.S. Pat. No. 7,406,394, which claims the benefit of priority to U.S. Provisional Application Ser. No. 60/710,682, filed Aug. 22, 2005. U.S. patent application Ser. No. 11/261,742 is also a continuation-in-part of U.S. application Ser. No. 11/213,344, filed Aug. 26, 2005, now U.S. Pat. No. 7,764,377. The contents of the prior applications are incorporated by reference.

BACKGROUND

The present invention relates to generally to chemical mechanical polishing of substrates.

An integrated circuit is typically formed on a substrate by the sequential deposition of conductive, semiconductive, or insulative layers on a silicon wafer. One fabrication step involves depositing a filler layer over a non-planar surface and planarizing the filler layer. For certain applications, the filler layer is planarized until the top surface of a patterned layer is exposed. A conductive filler layer, for example, can be deposited on a patterned insulative layer to fill the trenches or holes in the insulative layer. After planarization, the portions of the conductive layer remaining between the raised pattern of the insulative layer form vias, plugs, and lines that provide conductive paths between thin film circuits on the substrate. For other applications, such as oxide polishing, the filler layer is planarized until a predetermined thickness is left over the non planar surface. In addition, planarization of the substrate surface is usually required for photolithography.

Chemical mechanical polishing (CMP) is one accepted method of planarization. This planarization method typically requires that the substrate be mounted on a carrier or polishing head. The exposed surface of the substrate is typically placed against a rotating polishing disk pad or belt pad. The polishing pad can be either a standard pad or a fixed abrasive pad. A standard pad has a durable roughened surface, whereas a fixed-abrasive pad has abrasive particles held in a containment media. The carrier head provides a controllable load on the substrate to push it against the polishing pad. A polishing slurry is typically supplied to the surface of the polishing pad. The polishing slurry includes at least one chemically reactive agent and, if used with a standard polishing pad, abrasive particles.

One problem in CMP is determining whether the polishing process is complete, i.e., whether a substrate layer has been planarized to a desired flatness or thickness, or when a desired amount of material has been removed. Overpolishing (removing too much) of a conductive layer or film leads to increased circuit resistance. On the other hand, underpolishing (removing too little) of a conductive layer leads to electrical shorting. Variations in the initial thickness of the substrate layer, the slurry composition, the polishing pad condition, the relative speed between the polishing pad and the substrate, and the load on the substrate can cause variations in the material removal rate. These variations cause variations in the time needed to reach the polishing endpoint. Therefore, the polishing endpoint cannot be determined merely as a function of polishing time.

SUMMARY

In one general aspect, the invention features a computer implemented method that includes selecting two or more reference spectra. Each reference spectrum is a spectrum of white light reflected from a film of interest that is on a first substrate and that has a thickness greater than a target thickness. The reference spectra are empirically selected for particular spectra based endpoint determination logic so that the target thickness is achieved when endpoint is called by applying the particular spectra based endpoint logic. The method includes obtaining two or more current spectra. Each current spectrum is a spectrum of white light reflected from a film of interest that is on a second substrate and that has a current thickness that is greater than the target thickness. The film of interest on the second substrate is subject to a polishing step. The method includes determining, for the second substrate, whether an endpoint of the polishing step has been achieved, the determining being based on the reference spectra and the current spectra.

In another general aspect, the invention features a computer program product that is tangibly stored on machine readable medium. The product includes instructions operable to cause a processor to select two or more reference spectra. Each reference spectrum is a spectrum of white light reflected from a film of interest that is on a first substrate and that has a thickness greater than a target thickness. The reference spectra are empirically selected for particular spectra based endpoint determination logic so that the target thickness is achieved when endpoint is called by applying the particular spectra based endpoint logic. The product further comprises instructions to obtain two or more current spectra. Each current spectrum is a spectrum of white light reflected from a film of interest that is on a second substrate and that has a current thickness that is greater than the target thickness. The film of interest on the second substrate is subject to a polishing step. The product further comprising instructions to determine, for the second substrate, whether an endpoint of the polishing step has been achieved, the determining being based on the reference spectra and the current spectra.

As used in the instant specification, the term substrate can include, for example, a product substrate (e.g., which includes multiple memory or processor dies), a test substrate, a bare substrate, and a gating substrate. The substrate can be at various stages of integrated circuit fabrication, e.g., the substrate can be a bare wafer, or it can include one or more deposited and/or patterned layers. The term substrate can include circular disks and rectangular sheets.

Possible advantages of implementations of the invention can include one or more of the following. Endpoint determination can be made virtually without consideration of variations in polishing rate. Factors that affect polishing rate, for example, consumables, generally need not be considered. The use of multiple reference and/or target spectra (as oppose to a single reference spectrum and/or a single target spectrum) improves accuracy in endpoint determination by providing a difference or endpoint trace that is generally smoother than a trace generated by using a single reference-spectrum technique. A flushing system can be less likely to dry out slurry on a substrate surface being polished. A polishing pad window can enhance the accuracy and/or precision of endpoint determination.

The details of one or more embodiments of the invention are set forth in the accompanying drawings and the descrip-

BRIEF DESCRIPTION OF THE DRAWINGS

FIG. 6A shows a spectrum obtained from in-situ measurements.

FIGS. 9A and 9B show an alternative method for endpoint determination.

FIGS. 10A and 10B show another alternative method for endpoint determination.

Like reference numbers and designations in the various drawings indicate like elements.

DETAILED DESCRIPTION

Figure 1:
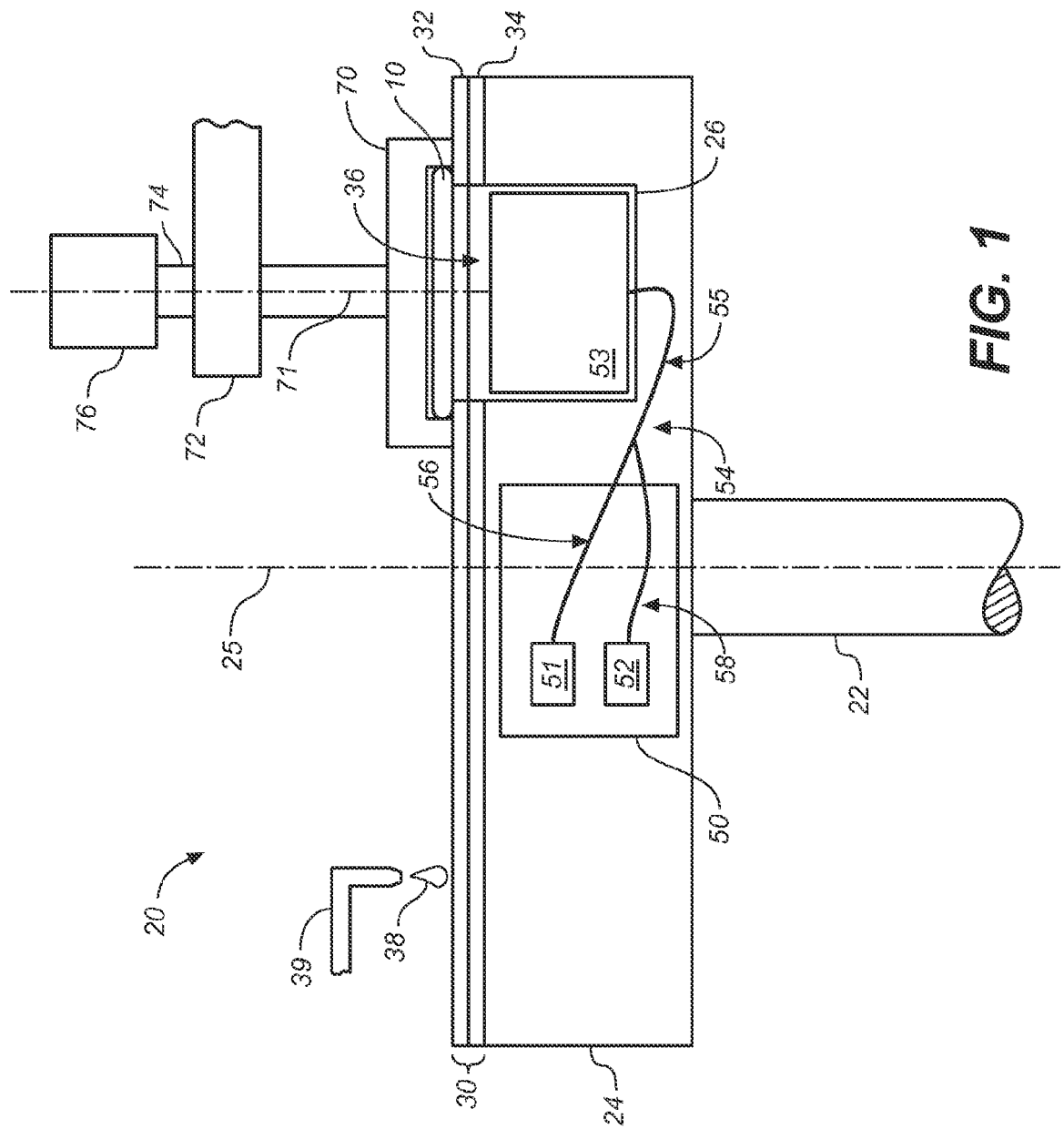
FIG. 1 shows a chemical mechanical polishing apparatus.

FIG. 1 shows a polishing apparatus 20 operable to polish a substrate 10. The polishing apparatus 20 includes a rotatable disk-shaped platen 24, on which a polishing pad 30 is situated. The platen is operable to rotate about axis 25. For example, a motor can turn a drive shaft 22 to rotate the platen 24. The polishing pad 30 can be detachably secured to the platen 24, for example, by a layer of adhesive. When worn, the polishing pad 30 can be detached and replaced. The polishing pad 30 can be a two-layer polishing pad with an outer polishing layer 32 and a softer backing layer 34.

Optical access 36 through the polishing pad is provided by including an aperture (i.e., a hole that runs through the pad) or a solid window. The solid window can be secured to the polishing pad, although in some implementations the solid window can be supported on the platen 24 and project into an aperture in the polishing pad. The polishing pad 30 is usually placed on the platen 24 so that the aperture or window overlies an optical head 53 situated in a recess 26 of the platen 24. The optical head 53 consequently has optical access through the aperture or window to a substrate being polished. The optical head is further described below.

The window can be, for example, a rigid crystalline or glassy material, e.g., quartz or glass, or a softer plastic material, e.g., silicone, polyurethane or a halogenated polymer (e.g., a fluoropolymer), or a combination of the materials mentioned. The window can be transparent to white light. If a top surface of the solid window is a rigid crystalline or glassy material, then the top surface should be sufficiently recessed from the polishing surface to prevent scratching. If the top surface is near and may come into contact with the polishing surface, then the top surface of the window should be a softer plastic material. In some implementations the solid window is secured in the polishing pad and is a polyurethane window, or a window having a combination of quartz and polyurethane. The window can have high transmittance, for example, approximately 80% transmittance, for monochromatic light of a particular color, for example, blue light or red light. The window can be sealed to the polishing pad 30 so that liquid does not leak through an interface of the window and the polishing pad 30.

In one implementation, the window includes a rigid crystalline or glassy material covered with an outer layer of a softer plastic material. The top surface of the softer material can be coplanar with the polishing surface. The bottom surface of the rigid material can be coplanar with or recessed relative to the bottom surface of the polishing pad. In particular, if the polishing pad includes two layers, the solid window can be integrated into the polishing layer, and the bottom layer can have an aperture aligned with the solid window.

Assuming that the window includes a combination of a rigid crystalline or glassy material and a softer plastic material, no adhesive need be used to secure the two portions. For example, in one implementation, no adhesive is used to couple the polyurethane portion to the quartz portion of the window. Alternatively, an adhesive that is transparent to white light can be used or an adhesive can be applied so that light passing through the window does not pass through the adhesive. By way of example, the adhesive can be applied only to the perimeter of the interface between the polyurethane and quartz portion. A refractive index gel can be applied to a bottom surface of the window.

A bottom surface of the window can optionally include one or more recesses. A recess can be shaped to accommodate, for example, an end of an optical fiber cable or an end of an eddy current sensor. The recess allows the end of the optical fiber cable or the end of the eddy current sensor to be situated at a distance, from a substrate surface being polished, that is less than a thickness of the window. With an implementation in which the window includes a rigid crystalline portion or glass like portion and the recess is formed in such a portion by machining, the recess is polished so as to remove scratches caused by the machining. Alternatively, a solvent and/or a liquid polymer can be applied to the surfaces of the recess to remove scratches caused by machining. The removal of scratches usually caused by machining reduces scattering and can improve the transmittance of light through the window.

Figure 2A:
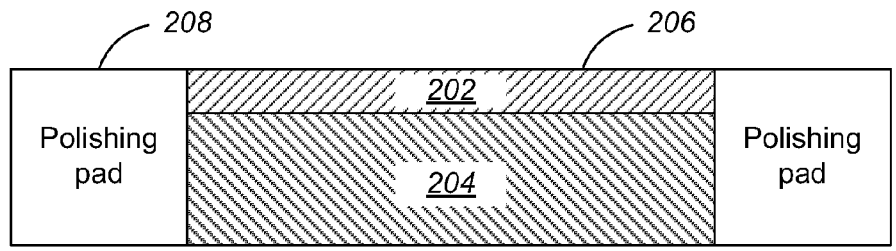
FIGS. 2A-2H show implementations of a polishing pad window.

FIG. 2A-2H show various implementations of the window. As shown in FIG. 2A, the window can have two portions, a polyurethane portion 202 and a quartz portion 204. The portions are layers, with the polyurethane portion 202 situated on top of the quartz portion 204. The window can be situated in the polishing pad so that the top surface 206 of the polyurethane layer is coplanar with a polishing surface 208 of the polishing pad.

Figure 2B:
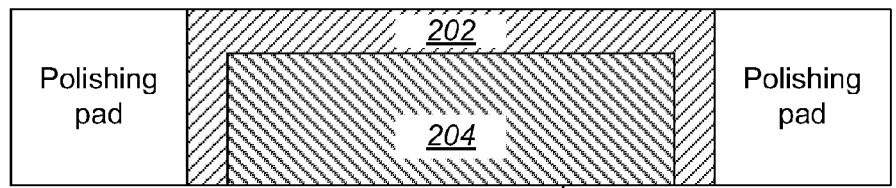

As shown in FIG. 2B, the polyurethane portion 202 can have a recess in which the quartz portion is situated. A bottom surface 210 of the quartz portion is exposed.

Figure 2C:
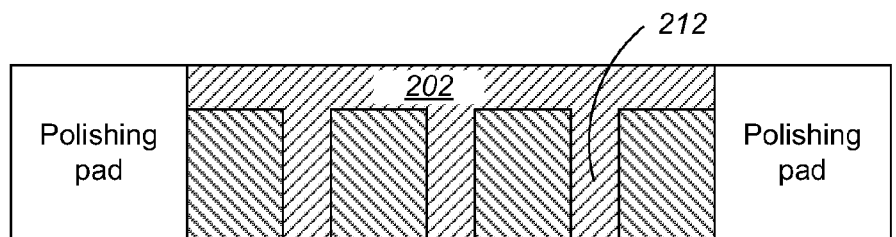

As shown in FIG. 2C, the polyurethane portion 202 can include projections, for example, projection 212, that project into the quartz portion 204. The projections can act to reduce the likelihood that the polyurethane portion 202 will be pulled away from the quartz portion 204 due to friction from the substrate or retaining ring.

Figure 2D:
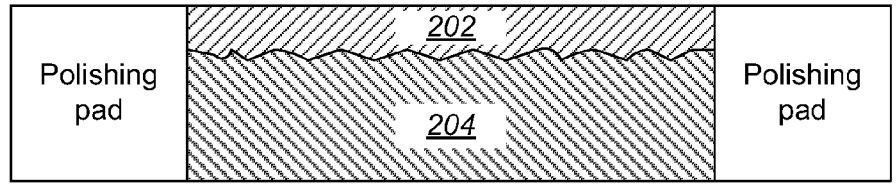

As shown in FIG. 2D, the interface between the polyurethane portion 202 and quartz portion 204 can be a rough surface. Such a surface can improve the strength of the coupling of the two portions of the window, also reducing the likelihood the polyurethane portion 202 will be pulled away from the quartz portion 204 due to friction from the substrate or retaining ring.

Figure 2E:
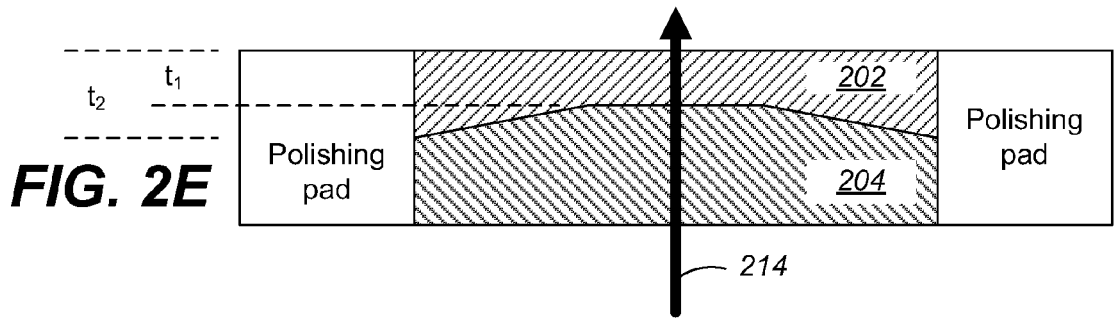

As shown in FIG. 2E, the polyurethane portion 202 can have non-uniform thickness. The thickness at a location that would be in the path 214 of a light beam is less than the thickness at a location that would not be in the path 214 of the light beam. By way of example, thickness $t_1$ is less than thickness $t_2$. Alternatively, the thickness can be less at the edges of the window.

Figure 2F:
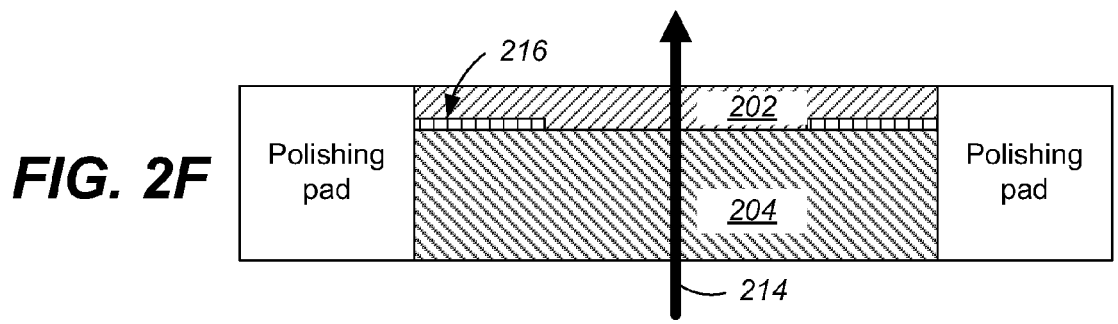

As shown in FIG. 2F, the polyurethane portion 202 can be attached to the quartz portion 204 by use of an adhesive 216. The adhesive can be applied so that it would not be in the path 214 of the light beam.

Figure 2G:
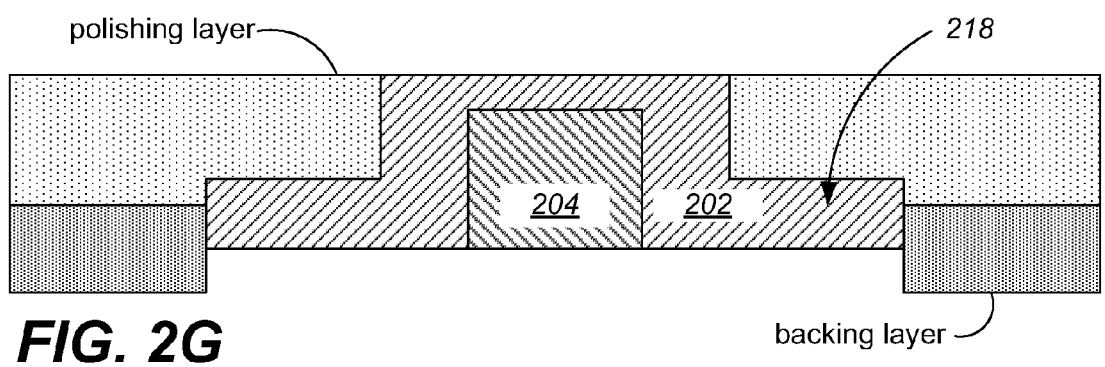

As shown in FIG. 2G, the polishing pad can include a polishing layer and a backing layer. The polyurethane portion 202 extends through the polishing layer and at least partially into the backing layer. The hole in the backing layer can be larger in size than the hole in the polishing layer, and the section of the polyurethane in the backing layer can be wider than the section of the polyurethane in the polishing layer. The polishing layer thus provides a lip 218 which overhangs the window and which can act to resist a pulling of the polyurethane portion 202 away from the quartz portion 204. The polyurethane portion 202 conforms to the holes of the layers of the polishing pad.

Figure 2H:
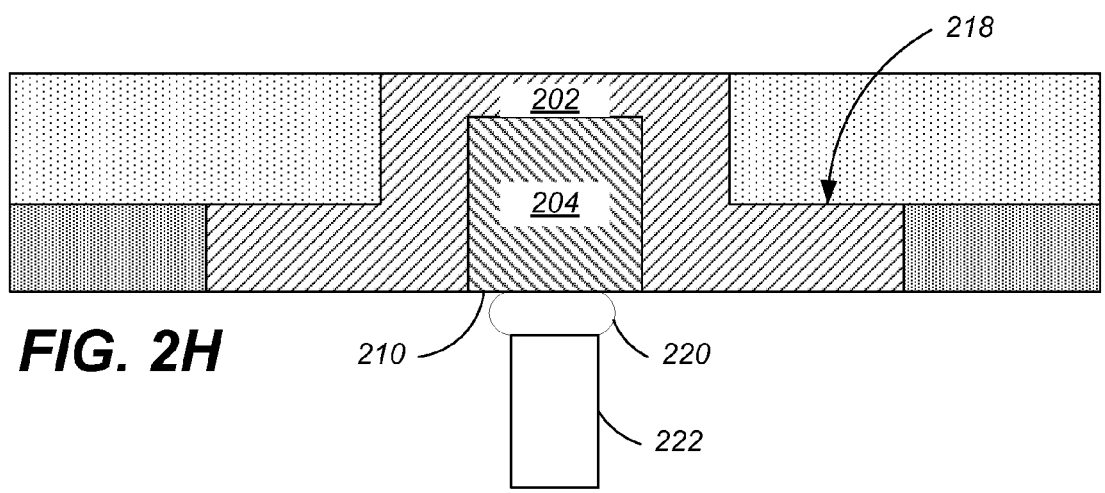

As shown in FIG. 2H, refractive index gel 220 can be applied to the bottom surface 210 of the quartz portion 204 so as to provide a medium for light to travel from a fiber cable 222 to the window. The refractive index gel 220 can fill the volume between the fiber cable 222 and the quartz portion 204 and can have a refractive index that matches or is between the indices of refraction of the fiber cable 222 and the quartz portion 204.

In implementations where the window includes both quartz and polyurethane portions, the polyurethane portion should have a thickness so that, during the life time of the polishing pad, the polyurethane portion will not be worn so as to expose the quartz portion. The quartz can be recessed from the bottom surface of the polishing pad, and the fiber cable 222 can extend partially into the polishing pad.

The above described window and polishing pad can be manufactured using a variety of techniques. The polishing pad's backing layer 34 can be attached to its outer polishing layer 32, for example, by adhesive. The aperture that provides optical access 36 can be formed in the pad 30, e.g., by cutting or by molding the pad 30 to include the aperture, and the window can be inserted into the aperture and secured to the pad 30, e.g., by an adhesive. Alternatively, a liquid precursor of the window can be dispensed into the aperture in the pad 30 and cured to form the window. Alternatively, a solid transparent element, e.g., the above described crystalline or glass like portion, can be positioned in liquid pad material, and the liquid pad material can be cured to form the pad 30 around the transparent element. In either of the later two cases, a block of pad material can be formed, and a layer of polishing pad with the molded window can be scythed from the block.

With an implementation in which the window includes a crystalline or glass like first portion and a second portion made of soft plastic material, the second portion can be formed in the aperture of the pad 30 by applying the described liquid precursor technique. The first portion can then be inserted. If the first portion is inserted before the liquid precursor of the second portion is cured, then curing can bond the first and second portions. If the first portion is inserted after the liquid precursor is cured, then the first and second potions can be secured by using an adhesive.

The polishing apparatus 20 can include a flushing system to improve light transmission through the optical access 36. There are different implementations of the flushing system. With implementations of the polishing apparatus 20 in which the polishing pad 30 includes an aperture instead of a solid window, the flushing system is implemented to provide a laminar flow of a fluid, e.g., a gas or liquid, across a top surface of the optical head 53. (The top surface can be a top surface of a lens included in the optical head 53.) The laminar flow of fluid across the top surface of the optical head 53 can sweep opaque slurry out of the optical access and/or prevent slurry from drying on the top surface and, consequently, improves transmission through the optical access. With implementations in which the polishing pad 30 includes a solid window instead of an aperture, the flushing system is implemented to direct a flow of gas at a bottom surface of the window. The flow of gas can prevent condensation from forming at the solid window's bottom surface which would otherwise impede optical access.

Figure 3:
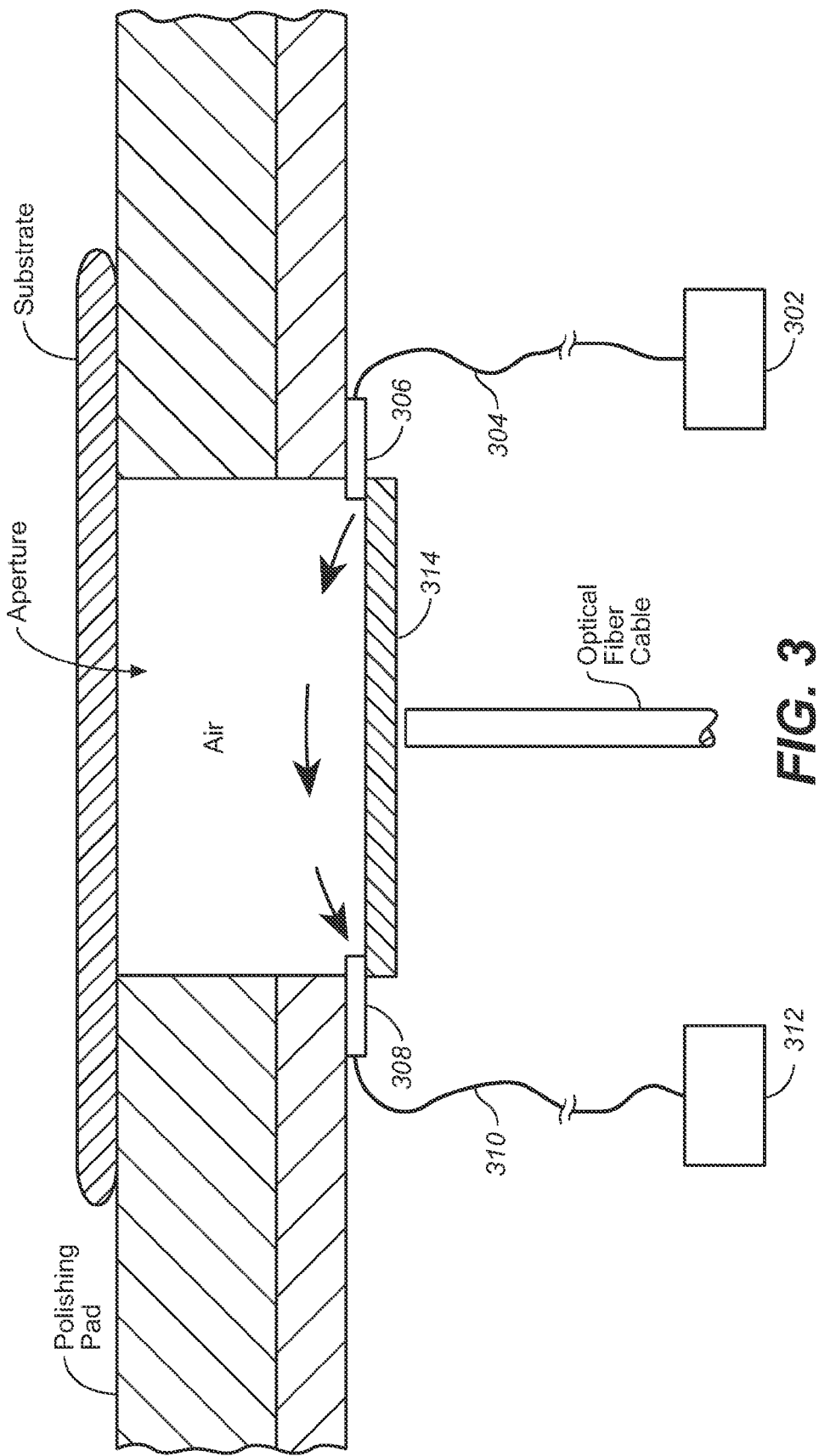
FIG. 3 shows an implementation of a flushing system.

FIG. 3 shows an implementation of the laminar-flow flushing system. The flushing system includes a gas source 302, a delivery line 304, a delivery nozzle 306, a suction nozzle 308, a vacuum line 310, and a vacuum source 312. The gas source 302 and vacuum source can be configured so that they can introduce and suction a same or a similar volume of gas. The delivery nozzle 306 is situated so that the laminar flow of gas is directed across the transparent top surface 314 of the in-situ monitoring module and not directed at the substrate surface being polished. Consequently, the laminar flow of gas does not dry out slurry on a substrate surface being polished, which can undesirably affect polishing.

Figure 4:
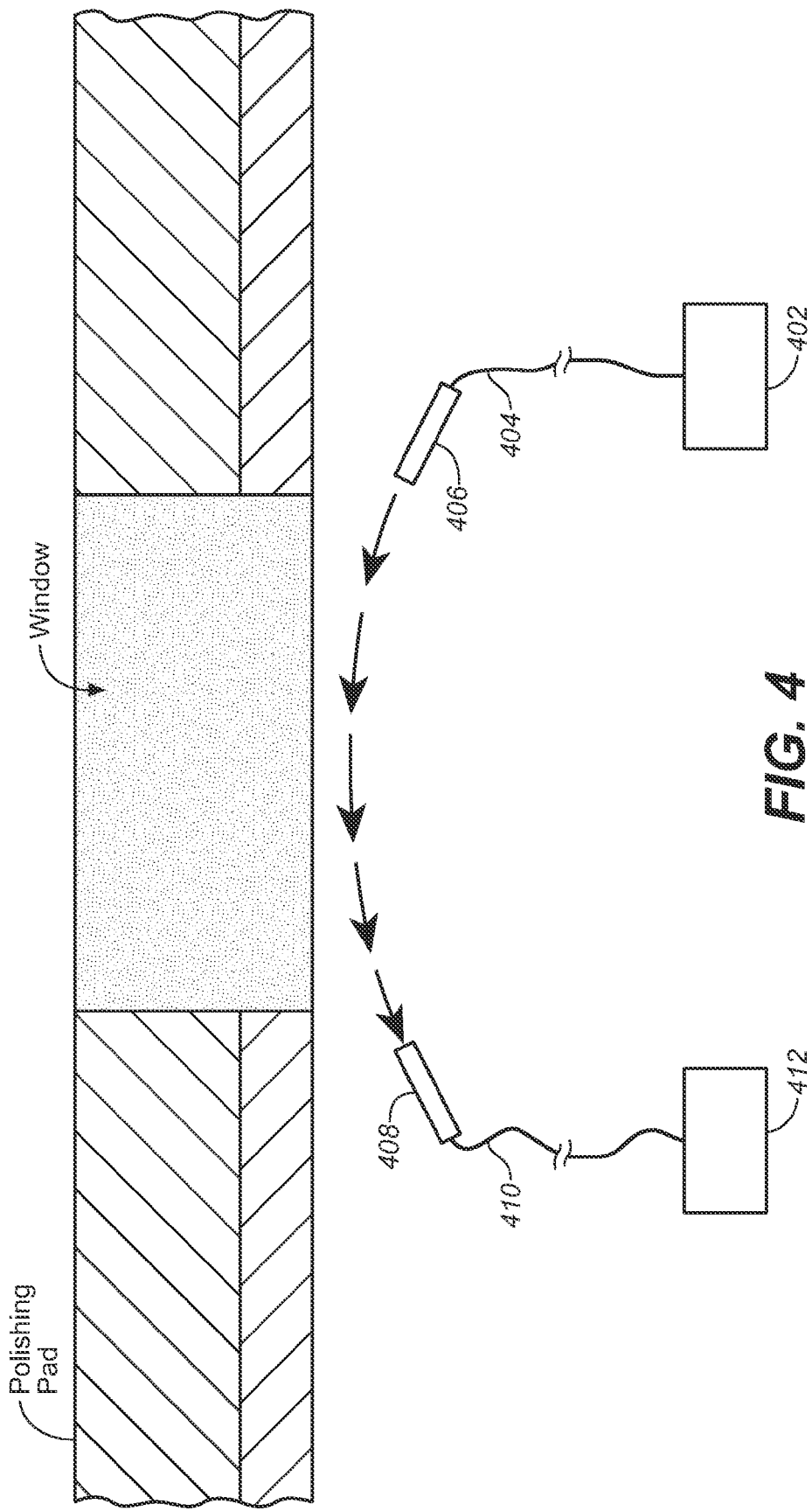
FIG. 4 shows an alternative implementation of the flushing system.

FIG. 4 shows an implementation of the flushing system for preventing the formation of condensation on a bottom surface of the solid window. The system reduces or prevents the formation of condensation at the bottom surface of the polishing pad window. The system includes a gas source 402, a delivery line 404, a delivery nozzle 406, a suction nozzle 408, a vacuum line 410, and a vacuum source 412. The gas source 402 and vacuum source can be configured so that they can introduce and suction a same or a similar volume of gas. The delivery nozzle 406 is situated so that the flow of gas is directed at the bottom surface window in the polishing pad 30.

In one implementation that is an alternative to the implementation of FIG. 4, the flushing system does not include a vacuum source or line. In lieu of these components, the flushing system includes a vent formed in the platen so that the gas introduced into the space underneath the solid window can be exhausted to a side of the platen or, alternatively, to any other location in the polishing apparatus that can tolerate moisture.

The above described gas source and vacuum source can be located away from the platen so that they do not rotate with the platen. In this case, a rotational coupler for convey gas is included each of the supply line and the vacuum line.

Returning to FIG. 1, the polishing apparatus 20 includes a combined slurry/rinse arm 39. During polishing, the arm 39 is operable to dispense slurry 38 containing a liquid and a pH adjuster. Alternative, the polishing apparatus includes a slurry port operable to dispense slurry onto polishing pad 30.

The polishing apparatus 20 includes a carrier head 70 operable to hold the substrate 10 against the polishing pad 30. The carrier head 70 is suspended from a support structure 72, for example, a carousel, and is connected by a carrier drive shaft 74 to a carrier head rotation motor 76 so that the carrier head can rotate about an axis 71. In addition, the carrier head 70 can oscillate laterally in a radial slot formed in the support structure 72. In operation, the platen is rotated about its central axis 25, and the carrier head is rotated about its central axis 71 and translated laterally across the top surface of the polishing pad.

The polishing apparatus also includes an optical monitoring system, which can be used to determine a polishing endpoint as discussed below. The optical monitoring system includes a light source 51 and a light detector 52. Light passes from the light source 51, through the optical access 36 in the polishing pad 30, impinges and is reflected from the substrate 10 back through the optical access 36, and travels to the light detector 52.

A bifurcated optical cable 54 can be used to transmit the light from the light source 51 to the optical access 36 and back from the optical access 36 to the light detector 52. The bifurcated optical cable 54 can include a "trunk" 55 and two "branches" 56 and 58.

As mentioned above, the platen 24 includes the recess 26, in which the optical head 53 is situated. The optical head 53 holds one end of the trunk 55 of the bifurcated fiber cable 54, which is configured to convey light to and from a substrate surface being polished. The optical head 53 can include one or more lenses or a window overlying the end of the bifurcated fiber cable 54 (e.g., as shown in FIG. 3). Alternatively, the optical head 53 can merely hold the end of the trunk 55 adjacent the solid window in the polishing pad. The optical head 53 can hold the above-described nozzles of the flushing system. The optical head 53 can be removed from the recess 26 as required, for example, to effect preventive or corrective maintenance.

The platen includes a removable in-situ monitoring module 50. The in-situ monitoring module 50 can include one or more of the following: the light source 51, the light detector 52, and circuitry for sending and receiving signals to and from the light source 51 and light detector 52. For example, the output of the detector 52 can be a digital electronic signal that passes through a rotary coupler, e.g., a slip ring, in the drive shaft 22 to the controller for the optical monitoring system. Similarly, the light source can be turned on or off in response to control commands in digital electronic signals that pass from the controller through the rotary coupler to the module 50.

The in-situ monitoring module can also hold the respective ends of the branch portions 56 and 58 of the bifurcated optical fiber 54. The light source is operable to transmit light, which is conveyed through the branch 56 and out the end of the trunk 55 located in the optical head 53, and which impinges on a substrate being polished. Light reflected from the substrate is received at the end of the trunk 55 located in the optical head 53 and conveyed through the branch 58 to the light detector 52.

In one implementation, the bifurcated fiber cable 54 is a bundle of optical fibers. The bundle includes a first group of optical fibers and a second group of optical fibers. An optical fiber in the first group is connected to convey light from the light source 51 to a substrate surface being polished. An optical fiber in the second group is connected to received light reflecting from the substrate surface being polished and convey the received light to a light detector. The optical fibers can be arranged so that the optical fibers in the second group form an X-like shape that is centered on the longitudinal axis of the bifurcated optical fiber 54 (as viewed in a cross section of the bifurcated fiber cable 54). Alternatively, other arrangements can be implemented. For example, the optical fibers in the second group can form V-like shapes that are mirror images of each other. A suitable bifurcated optical fiber is available from Verity Instruments, Inc. of Carrollton, Tex.

There is usually an optimal distance between the polishing pad window and the end of the trunk 55 of bifurcated fiber cable 54 proximate to the polishing pad window. The distance can be empirically determined and is affected by, for example, the reflectivity of the window, the shape of the light beam emitted from the bifurcated fiber cable, and the distance to the substrate being monitored. In one implementation, the bifurcated fiber cable is situated so that the end proximate to the window is as close as possible to the bottom of the window without actually touching the window. With this implementation, the polishing apparatus 20 can include a mechanism, e.g., as part of the optical head 53, that is operable to adjust the distance between the end of the bifurcated fiber cable 54 and the bottom surface of the polishing pad window. Alternatively, the proximate end of the bifurcated fiber cable is embedded in the window.

The light source 51 is operable to emit white light. In one implementation, the white light emitted includes light having wavelengths of 200-800 nanometers. A suitable light source is a xenon lamp or a xenon-mercury lamp.

The light detector 52 can be a spectrometer. A spectrometer is basically an optical instrument for measuring properties of light, for example, intensity, over a portion of the electromagnetic spectrum. A suitable spectrometer is a grating spectrometer. Typical output for a spectrometer is the intensity of the light as a function of wavelength.

Optionally, the in-situ monitoring module 50 can include other sensor elements. The in-situ monitoring module 50 can include, for example, eddy current sensors, lasers, light emitting diodes, and photodetectors. With implementations in which the in-situ monitoring module 50 includes eddy current sensors, the module 50 is usually situated so that a substrate being polished is within working range of the eddy current sensors.

Figure 5:
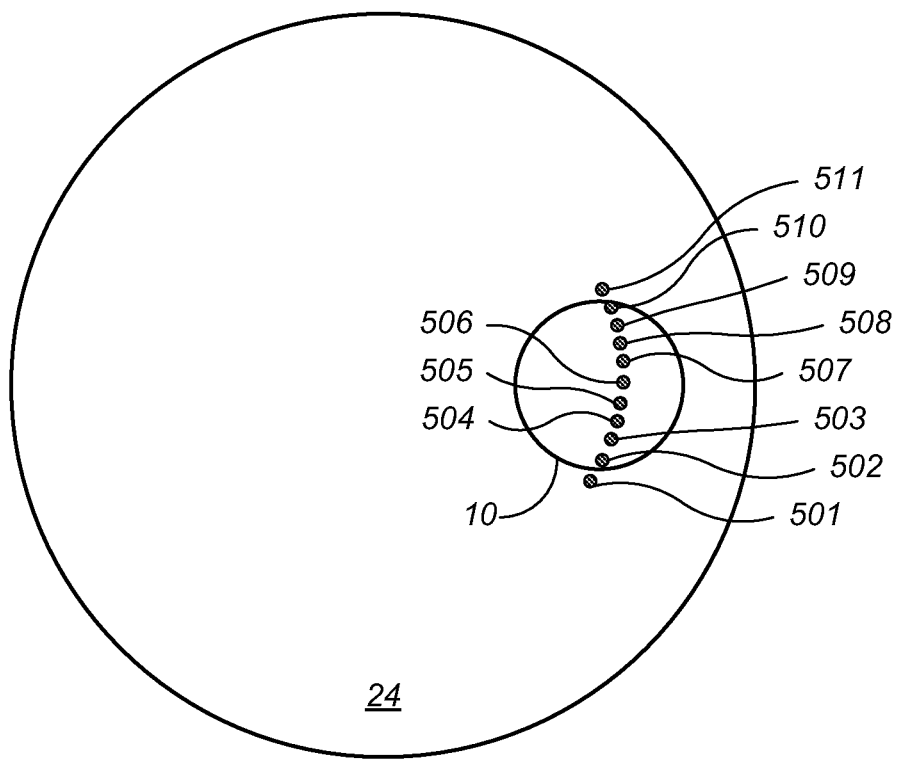
FIG. 5 is an overhead view of a polishing pad and shows locations where in-situ measurements are taken.

The light source 51 and light detector 52 are connected to a computing device operable to control their operation and to receive their signals. The computing device can include a microprocessor situated near the polishing apparatus, e.g., a personal computer. With respect to control, the computing device can, for example, synchronize activation of the light source 51 with the rotation of the platen 24. As shown in FIG. 5, the computer can cause the light source 51 to emit a series of flashes starting just before and ending just after the substrate 10 passes over the in-situ monitoring module. (Each of points 501-511 depicted represents a location where light from the in-situ monitoring module impinged and reflected off.) Alternatively, the computer can cause the light source 51 to emit light continuously starting just before and ending just after the substrate 10 passes over the in-situ monitoring module.

With respect to receiving signals, the computing device can receive, for example, a signal that carries information describing a spectrum of the light received by the light detector 52. FIG. 6A shows examples of a spectrum measured from light that is emitted from a single flash of the light source and that is reflected from the substrate. Spectrum 602 is measured from light reflected from a product substrate. Spectrum 604 is measured from light reflected from a base silicon substrate (which is a wafer that has only a silicon layer). Spectrum 606 is from light received by the optical head 53 when there is no substrate situated over the optical head 53. Under this condition, referred to in the present specification as a dark condition, the received light is typically ambient light.

The computing device can process the above-described signal to determine an endpoint of a polishing step. Without being limited to any particular theory, the spectra of light reflected from the substrate 10 evolve as polishing progresses.

Figure 6B:
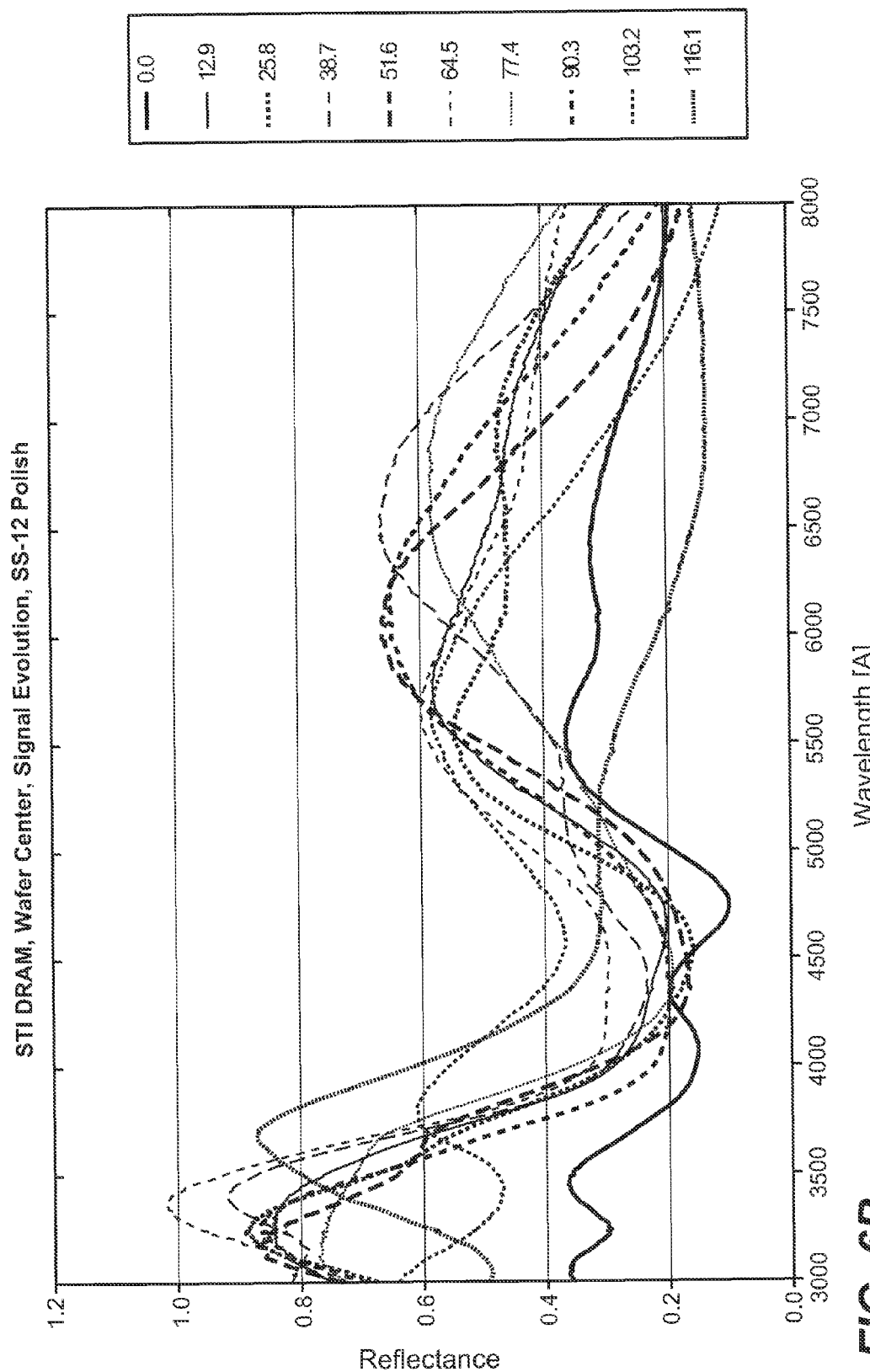
FIG. 6B illustrates the evolution of spectra obtained from in-situ measurements as polishing progresses.

FIG. 6B provides an example of the evolution as polishing of a film of interest progresses. The different lines of spectrum represent different times in the polishing. As can be seen, properties of the spectrum of the reflected light changes as a thickness of the film changes, and particular spectrums are exhibited by particular thicknesses of the film. The computing device can execute logic that determines, based on one or more of the spectra, when an endpoint has been reached. The one or more spectra on which an endpoint determination is based can include a target spectrum, a reference spectrum, or both.

As used in the instant specification, a target spectrum refers to a spectrum exhibited by the white light reflecting from a film of interest when the film of interest has a target thickness. By way of example, a target thickness can be 1, 2, or 3 microns. Alternatively, the target thickness can be zero, for example, when the film of interest is cleared so that an underlying film is exposed.

There can be and usually are multiple target spectra for a particular thickness of interest. Such is the case because polishing usually occurs at a finite rate so that the film of interest maintains the target thickness for a duration during which multiple spectra can be collected. Moreover, different regions of a patterned substrate usually yield different spectra (even when the spectra were obtained at a same point of time during polishing). For example, a spectrum of the light reflecting off a scribe line in a substrate is different (e.g., have a different shape) from the spectrum of the light reflecting off an array of the substrate. Such a phenomenon is referred to in the instant specification as a pattern effect. Thus, there can be multiple spectra for a particular target thickness, and the multiple spectra can include spectra that are different from each other because of pattern effects.

Figures 7A, 8A:
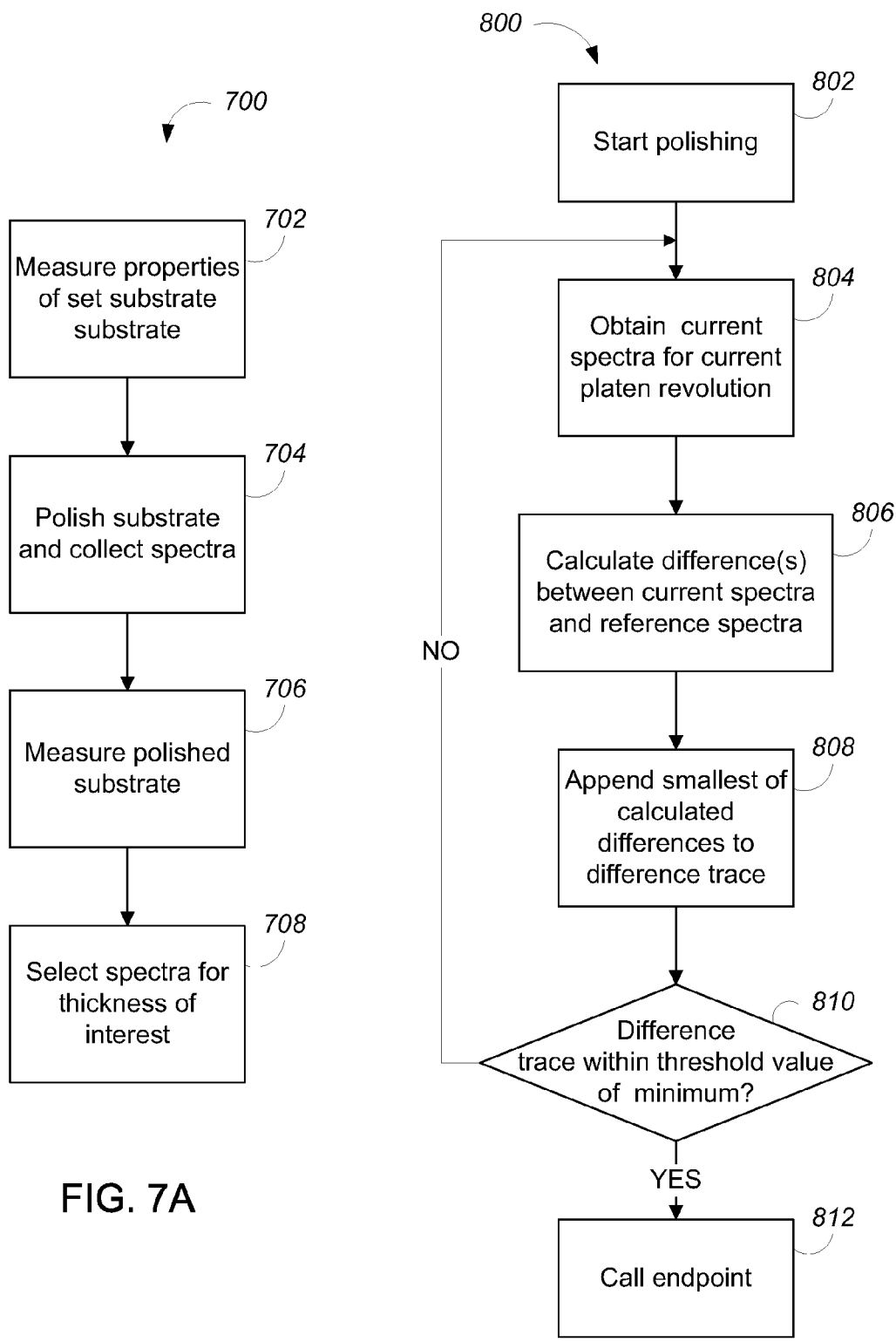
FIG. 7A shows a method for obtaining a target spectrum.
FIGS. 8A and 8B show a method for endpoint determination.

FIG. 7A shows a method 700 for obtaining one or more target spectra. Properties of a substrate with the same pattern as the product substrate are measured (step 702). The substrate which is measured is referred to in the instant specification as a "set-up" substrate. The set-up substrate can simply be a substrate which is similar or the same to the product substrate, or the set-up substrate could be one substrate from a batch. The properties can include a pre-polished thickness of a film of interest at a particular location of interest on the substrate. Typically, the thicknesses at multiple locations are measured. The locations are usually selected so that a same type of die feature is measured for each location. Measurement can be performed at a metrology station.

The set-up substrate is polished in accordance with a polishing step of interest and spectra of white light reflecting off a substrate surface being polished are collected during polishing (step 704). Polishing and spectra collection can be performed at the above described polishing apparatus. Spectra are collected by the in-situ monitoring system during polishing. Multiple spectra can be collected for each platen revolution. The substrate is overpolished, i.e., polished past an estimated endpoint, so that the spectrum of the light that reflected from the substrate when the target thickness is achieved can be obtained.

Properties of the overpolished substrate are measured (step 706). The properties include post-polished thicknesses of the film of interest at the particular location or locations used for the pre-polish measurement.

The measured thicknesses and the collected spectra are used to select, from among the collected spectra, one or more spectra determined to be exhibited by the substrate when it had a thickness of interest (step 708). In particular, linear interpolation can be performed using the measured pre-polish film thickness and post-polish substrate thicknesses to determine which of the spectra was exhibited when the target film thickness was achieved. The spectra determined to be the ones exhibited when the target thickness was achieved are designated to be the target spectra for the batch of substrates. Typically, three of the collected spectra are designated to be target spectra. Alternatively, five, seven, and nine spectra are designated to be target spectra.

Optionally, the spectra collected are processed to enhance accuracy and/or precision. The spectra can be processed, for example: to normalize them to a common reference, to average them, and/or to filter noise from them. Particular implementations of these processing operations are described below.

As used in the instant specification, a reference spectrum refers to a spectrum that is associated with a target film thickness. Two or more reference spectra are usually empirically selected for particular spectra based endpoint determination logic so that the target thickness is achieved when the computer device calls endpoint by applying the particular spectra based endpoint determination logic. The reference spectra can be iteratively selected, as will be described below in reference to FIG. 7B. Reference spectra are usually not the target spectra. Rather, reference spectra are usually the spectra of light reflected from the substrate when the film of interest has a thickness greater than the target thickness.

Figure 7B:
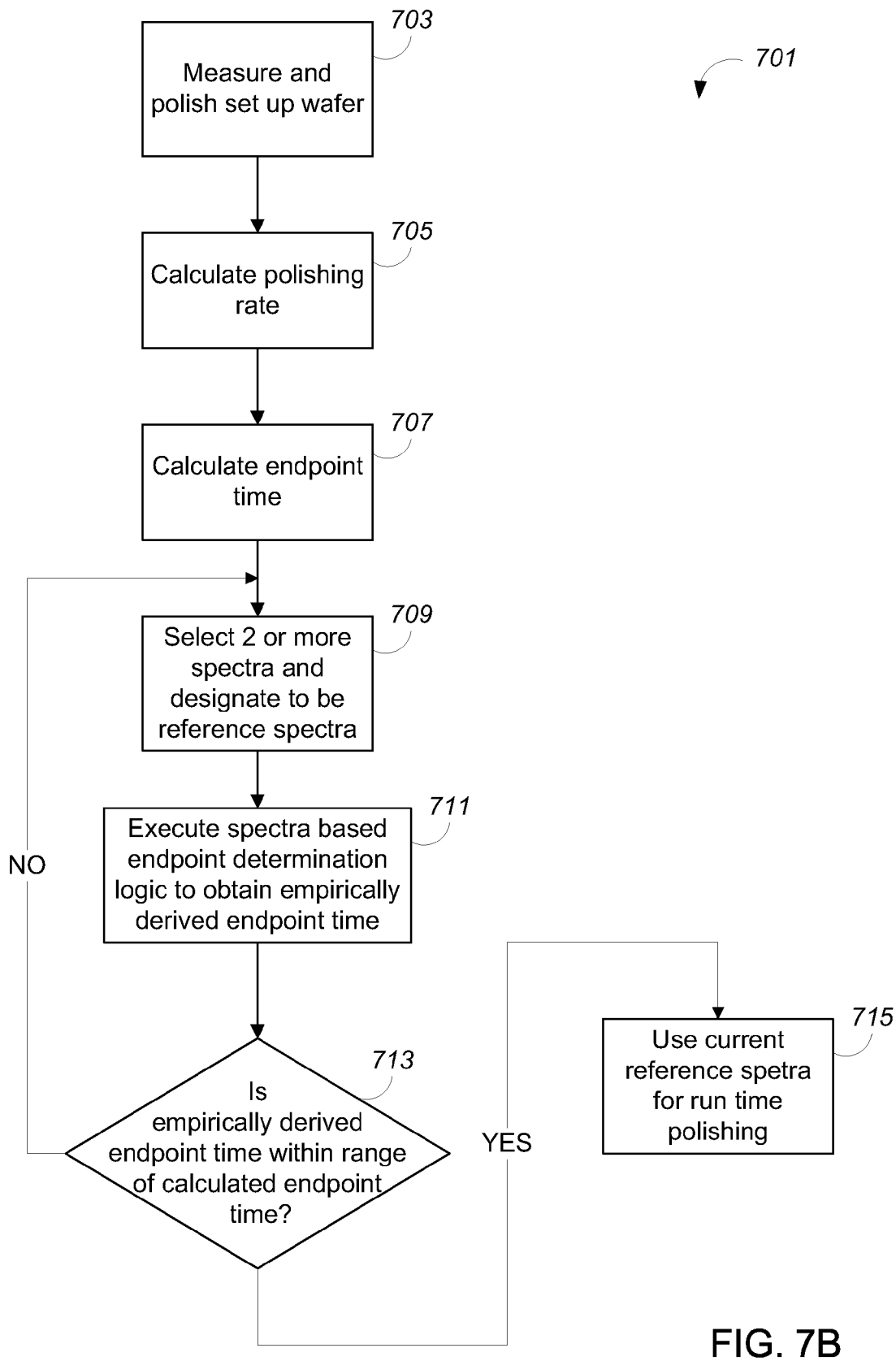
FIG. 7B shows a method for obtaining a reference spectrum.

FIG. 7B shows a method 701 for selecting two or more reference spectra for a particular target thickness and particular spectra based endpoint determination logic. A set up substrate is measured and polished as described above in steps 702-706 (step 703). In particular, spectra collected and the time at which each collected spectrum is measured is stored. Multiple spectra are be collected for each platen revolution during the polishing.

A polishing rate of the polishing apparatus for the particular set-up substrate is calculated (step 705). The average polishing rate PR can be calculated by using the pre and post-polished thicknesses T1, T2, and the actual polish time, PT, e.g., PR=(T2−T1)/PT.

An endpoint time is calculated for the particular set-up substrate to provide a calibration point to test the reference spectrum, as discussed below (step 707). The endpoint time can be calculated based on the calculated polish rate PR, the pre-polish starting thickness of the film of interest, ST, and the target thickness of the film of interest, TT. The endpoint time can be calculated as a simple linear interpolation, assuming that the polishing rate is constant through the polishing process, e.g., ET=(ST−TT)/PR.

Optionally, the calculated endpoint time can be evaluated by polishing another substrate of the batch of patterned substrates, stopping polishing at the calculated endpoint time, and measuring the thickness of the film of interest. If the thickness is within a satisfactory range of the target thickness, then the calculated endpoint time is satisfactory. Otherwise, the calculated endpoint time can be re-calculated.

Two or more of the collected spectra are selected and designated to be the reference spectra (step 709). The spectra selected to be the reference spectra are the spectra of light reflected from the substrate when the film of interest has a thickness greater than and approximately equal to the target thickness. Typically, three of the collected spectra are designated to be reference spectra. Alternatively, five, seven, or nine spectra are designated to be reference spectra. As with the target spectra, there can be multiple reference spectra because the polishing rate is finite.

In one implementation, the particular platen revolution corresponding to the endpoint time calculated in step 707 is identified, and spectra collected during the particular platen revolution are selected to be designated as reference spectra. By way of example, spectra collected can be from a center region of the substrate. The platen revolution corresponding to the endpoint time calculated is the platen revolution during which a time corresponding to the calculated endpoint time occurred. By way of example, if the calculated endpoint time was 25.5 seconds, then the particular platen revolution corresponding to this calculated endpoint time is the platen revolution during which 25.5 second of polishing has occurred in the polishing process.

The use of multiple reference spectra

The particular spectra based endpoint determination logic is executed in simulation using the spectra collected for the set-up substrate and with the selected two or more spectra designated to be the reference spectra (step 711). Execution of the logic yields an empirically derived but simulated endpoint time that the logic has determined to be the endpoint.

The empirically derived but simulated endpoint time is compared to the calculated endpoint time (step 713). If the empirically derived endpoint time is within a threshold range of the calculated endpoint time, then the currently selected two or more reference spectra are known to generate a result that matches the calibration point. Thus, when the endpoint logic is executed using the reference spectra in a run-time environment, the system should reliably detect an endpoint at the target thickness. Therefore, the spectra currently designated to be the reference spectra can be kept as the reference spectra for run time polishing of the other substrates of the batch (step 715). Otherwise, steps 709 and 711 are repeated as appropriate.

Optionally, variables other than the selected spectra can be changed for each iteration (i.e., each performance of steps 709 and 711). For example, the above-mentioned processing of the spectra (for example, filter parameters) and/or a threshold range from a minimum of a difference trace can be changed. The difference trace and the threshold range of a minimum of the difference trace are described below.

FIG. 8A shows a method 800 for using spectra based endpoint determination logic to determine an endpoint of a polishing step. Another substrate of the batch of patterned substrates is polished using the above-described polishing apparatus (step 802). At each revolution of the platen, the following steps are performed.

Two or more spectra of white light reflecting off a substrate surface being polished are measured, and two or more current spectra for a current platen revolution are obtained (step 804). Spectra measure at points 501-511 (FIG. 5) are examples of spectra measured during the current platen revolution. The spectra measured during the current platen revolution are optionally processed to enhance accuracy and/or precision as described above in reference to FIG. 7A and as described below in reference to FIG. 11.

Two or more of the spectra measured during the current platen revolution are selected to be the current spectra for the current platen revolution. In one implementation, the spectra selected to be current spectra are those measured at sample locations near the center of the substrate (for example, at points 505, 506, and 507 shown in FIG. 5). The selected spectra are not averaged, and each selected spectra is designated to be a current spectrum for the current platen revolution.

A difference between each of the current spectra and each of the reference spectra is calculated (step 806). The reference spectra can be obtained as described above in reference to FIG. 7B. In one implementation, the difference is a sum of differences in intensities over a range of wavelengths. That is, $$\text{Difference} = \sum_{\lambda=a}^{b} \text{abs}(I_{current}(\lambda) - I_{reference}(\lambda))$$

where a and b are the lower limit and upper limit of the range of wavelengths of a spectrum, respectively, and $I_{current}(\lambda)$ and $I_{reference}(\lambda)$ are the intensity of a current spectra and the intensity of the target spectra for a given wavelength, respectively.

One way to calculate a difference between each of the current spectra and each of the reference spectra is to select each of the current spectra. For each selected current spectra, the difference is calculated against each of the reference spectra. Given current spectra e, f, and g, and reference spectra E, F, and G, for example, a difference would be calculated for each of the following combinations of current and reference spectra: e and E, e and F, e and G, f and E, f and F, f and G, g and E, g and F, and g and G.

The smallest of the calculated differences is appended to a difference trace (step 808). The difference trace is usually updated once per platen revolution. The difference trace is generally a plot of one of the calculated differences (in this case the smallest of the differences calculated for the current platen revolution). As an alternative to the smallest difference, another of the differences, for example, a median of the differences or the next to smallest difference, can be appended to the trace.

Taking the smallest of the differences can improve accuracy in the endpoint determination process. The current spectra can include spectra that are from light reflecting off different locations (e.g., a scribe line and an array) of the substrate, and the above-described pattern effect can cause these spectra to be significantly different. Likewise, the reference spectra can include spectra that are from light reflecting off different locations on the substrate. A comparison of such different spectra are faulty and can introduce error into endpoint determination. For example, a comparison of a current spectrum of light reflecting off a scribe line of a patterned substrate to a reference spectrum of light reflecting off an array of the patterned substrate can introduce error into the endpoint determination calculus. Such a comparison, figuratively speaking, is a comparison between apples and oranges. In considering only the smallest of the differences, these types of comparisons (even though they are made) are factored out of the calculus. Thus, by using multiple reference spectra and multiple current spectra, and by considering only the smallest of the differences between each of these spectra, errors that would be introduced by the described faulty comparison are avoided.

Optionally, the difference trace can be processed, for example, smoothing the difference trace by filtering out a calculated difference that deviates beyond a threshold from preceding one or more calculated differences.

Whether the difference trace is within a threshold value of a minimum is determined (step 810). After the minimum has been detected, the endpoint is called when the different trace begins to rise past a particular threshold value of the minimum. Alternatively, the endpoint can be called based on the slope of the difference trace. In particular, the slope of the difference trace approaches and becomes zero at the minimum of the difference trace. The endpoint can be called when the slope of the difference trace is within a threshold range of the slope that is near zero.

Optionally, window logic can be applied to facilitate the determination of step 808. Window logic suitable for use is described in commonly assigned U.S. Pat. Nos. 5,893,796 and 6,296,548, which are incorporated by reference.

If the difference trace is NOT determined to have reached a threshold range of a minimum, polishing is allowed to continue and steps 804, 806, 808, and 810 are repeated as appropriate. Otherwise, an endpoint is called and polishing is stopped (step 812).

Figure 8B:
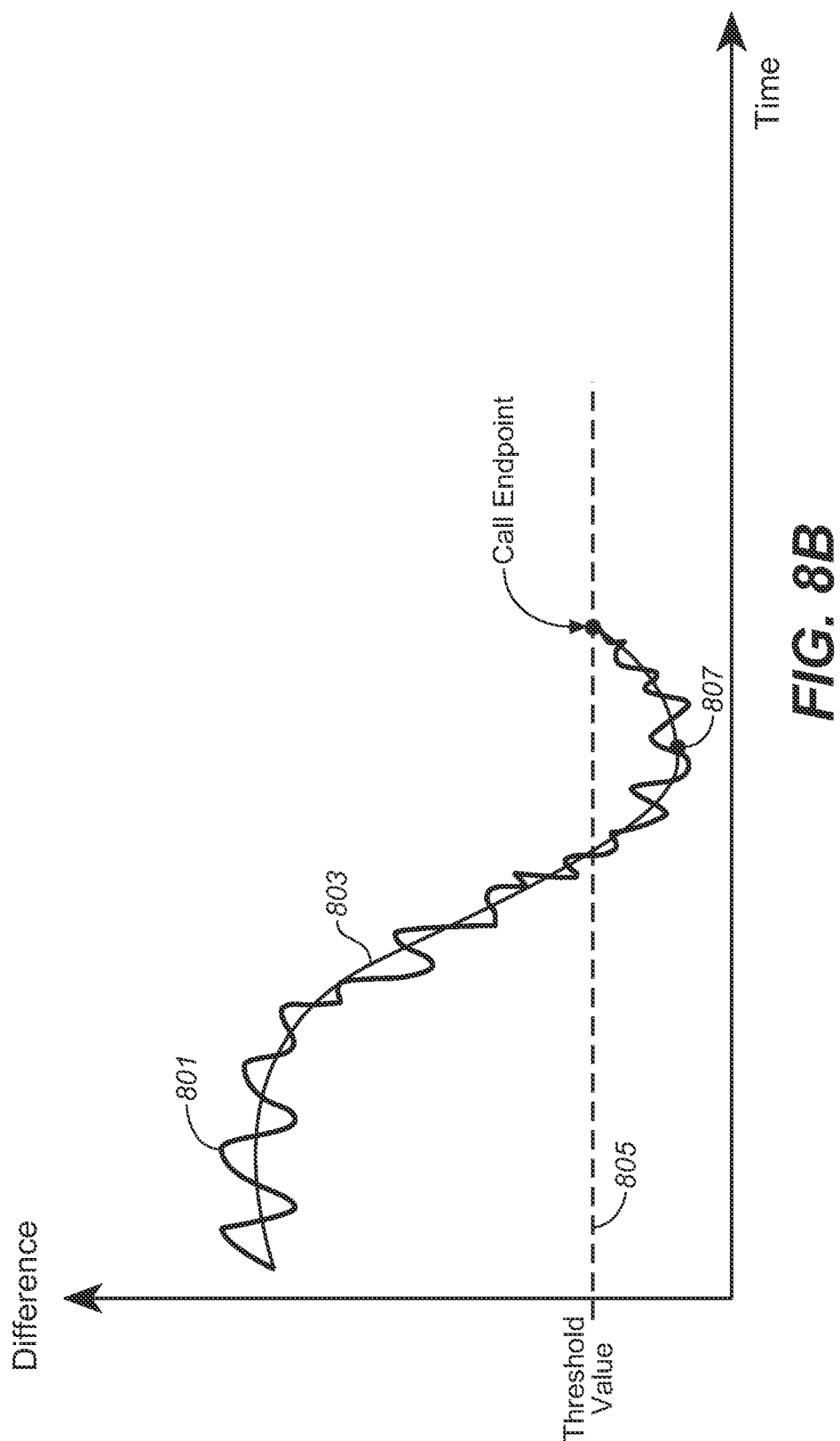

FIG. 8B illustrates the above described method for determining endpoint. Trace 801 is the raw difference trace. Trace 803 is the smoothed difference trace. Endpoint is called when the smoothed difference trace 803 reaches a threshold value 805 above the minimum 807.

As an alternative to using reference spectra, target spectra can be used in the method 800. The difference calculation would be between current spectra and target spectra, and endpoint would be determined when the difference trace reaches a minimum.

FIG. 9A shows an alternative method 900 for using a spectrum-based endpoint determination logic to determine an endpoint of a polishing step. A set-up substrate is polished and target spectra and reference spectra are obtained (step 902). These spectra can be obtained as described above in reference to FIGS. 7A and 7B.

A target difference is calculated (step 904). The target difference is the minimum of the differences between the reference spectra and the target spectra, which are calculated using the above-described difference equation and method for calculating differences (i.e., step 808).

Polishing of another substrate of the batch of substrates is started (step 906). The following steps are performed for each platen revolution during polishing. Two or more spectra of white light reflecting off a substrate surface being polished are measured to obtain two or more current spectra for a current platen revolution (step 908). Differences between the current spectra and the reference spectra are calculated (step 910). The smallest of the calculated differences is appended to a difference trace (step 912). (Steps 908, 910, and 912 are similar to steps 804, 806, and 808, respectively.) Whether the difference trace is within a threshold range of the target difference is determined (step 914). If the difference trace is NOT determined to have reached a threshold range of the target difference, polishing is allowed to continue and steps 908, 910, 912, and 914 are repeated as appropriate. Otherwise, an endpoint is called and polishing is stopped (step 916).

Figure 9B:
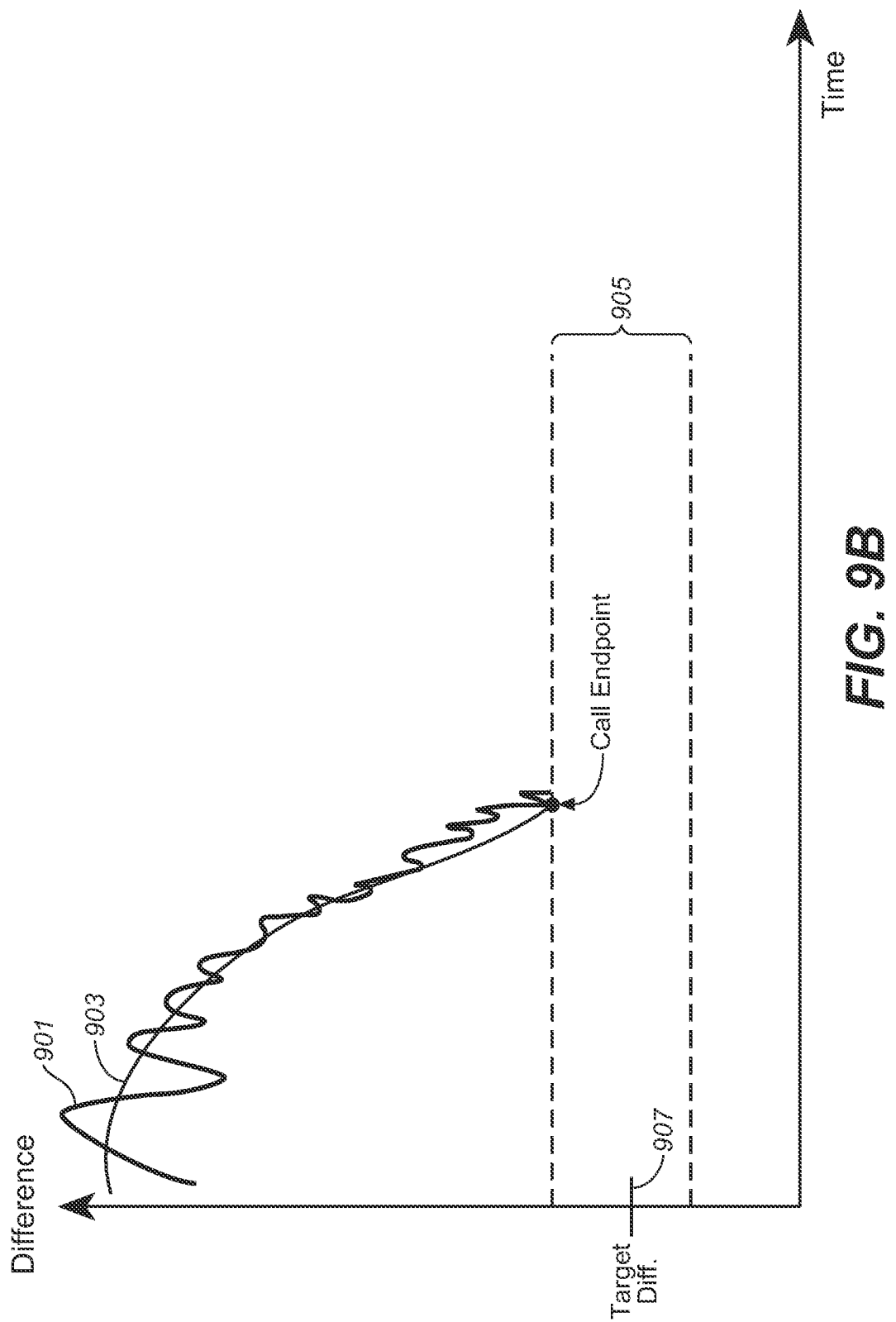

FIG. 9B illustrates the above described method for determining endpoint. Trace 901 is the raw difference trace. Trace 903 is the smoothed difference trace. Endpoint is called when the smooth difference trace 903 is within a threshold range 905 of a target difference 907.

FIG. 10A shows another method 1000 for determining an endpoint of a polishing step. Reference spectra are obtained (step 1002). The reference spectra are obtained as described above in reference to FIG. 7B.

The spectra collected from the process of obtaining the reference spectrum are stored in a library (step 1004). Alternatively, the library can include spectra that are not collected but theoretically generated. The spectra stored, including the reference spectra, are indexed so that each spectrum has a unique index value. The indexing is implemented so that the index values are sequenced in an order in which the spectra were measured. The index, thus, can be correlated to time and/or platen revolution. In one implementation, a first spectrum collected at a first point in time will have an index value that is less than a second spectrum that is collected at a later point in time. The library can be implemented in memory of the computing device of the polishing apparatus.

A substrate from the batch of substrates is polished, and the following steps are performed for each platen revolution. Two or more spectra are measured to obtain two or more current spectra for a current platen revolution (step 1006). The spectra are obtained as described above. Each current spectra is compared to the spectra stored in the library, and the library spectrum which best fits any of the current spectra is determined (step 1008). The index of the library spectrum determined to best fit any of the current spectra is appended to an endpoint index trace (step 1010). Endpoint is called when the endpoint trace reaches an index of any of the reference spectra (step 1012).

Figure 10B:
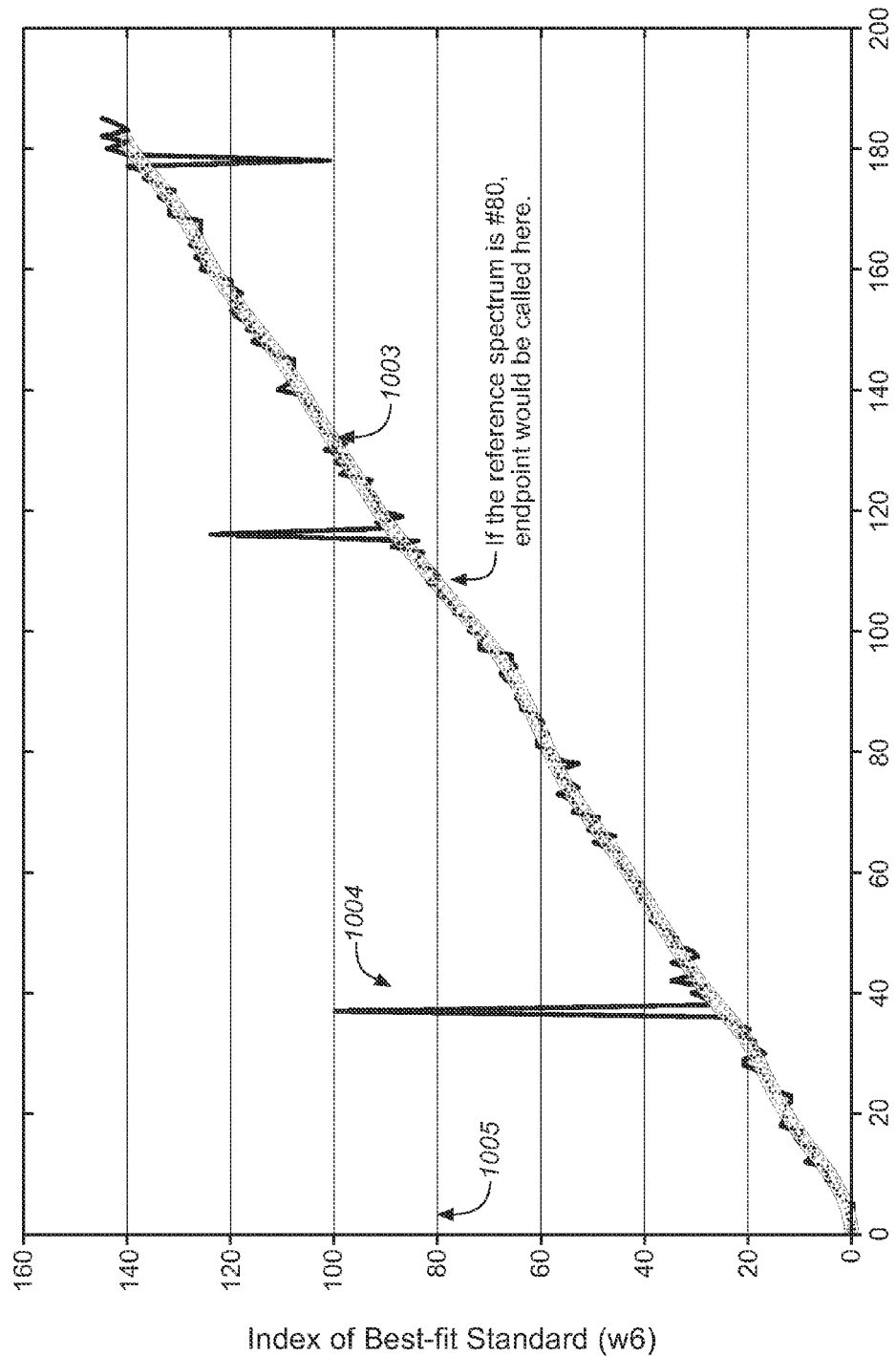

FIG. 10B illustrates the above described method for determining endpoint. Trace 1014 is the raw index trace. Trace 1016 is the smoothed difference trace. Line 1018 represents the index value of the reference spectrum. Multiple current spectra can be obtained in each sweep of the optical head beneath the substrate, e.g., a spectra for each radial zone on the substrate being tracked, and an index trace can be generated for each radial zone.

Figure 11:
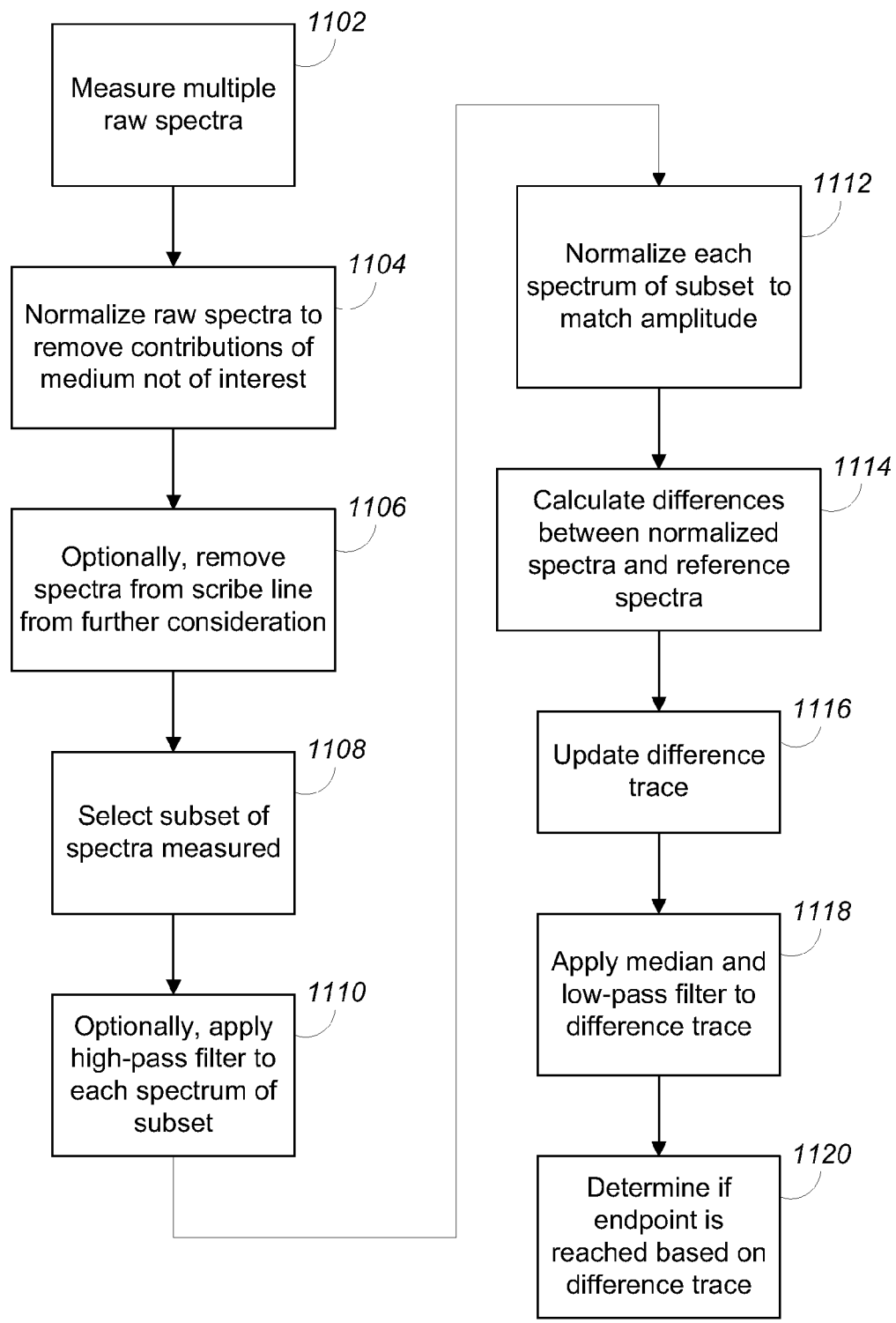
FIG. 11 shows an implementation for determining an endpoint.

FIG. 11 shows an implementation for determining an endpoint during a polishing step. For each platen revolution, the following steps are performed. Multiple raw spectra of white light reflecting off a substrate surface being polished are measured (step 1102).

Each measured raw spectra is normalized to remove light reflections contributed by mediums other than the film or films of interest (step 1104). Normalization of spectra facilitates their comparison to each other. Light reflections contributed by media other than the film or films of interest include light reflections from the polishing pad window and from the base silicon layer of the substrate. Contributions from the window can be estimated by measuring the spectrum of light received by the in-situ monitoring system under a dark condition (i.e., when no substrates are placed over the in-situ monitoring system). Contributions from the silicon layer can be estimated by measuring the spectrum of light reflecting of a bare silicon substrate. The contributions are usually obtained prior to commencement of the polishing step.

A measured raw spectrum is normalized as follows:

$$\text{normalized spectrum} = (A - \text{Dark})/(Si - \text{Dark})$$

where A is the raw spectrum, Dark is the spectrum obtained under the dark condition, and Si is the spectrum obtained from the bare silicon substrate.

Optionally, the collected spectra can be sorted based on the region of the pattern that has generated the spectrum, and spectra from some regions can be excluded from the endpoint calculation. In particular, spectra that are from light reflecting off scribe lines can be removed from consideration (step 1106). As discussed above, different regions of a pattern substrate usually yield different spectra (even when the spectra were obtained at a same point of time during polishing). For example, a spectrum of the light reflecting off a scribe line in a substrate is different from the spectrum of the light reflecting off an array of the substrate. Because of their different shapes, use of spectra from both regions of the pattern usually introduces error into the endpoint determination. However, the spectra can be sorted based on their shapes into a group for scribe lines and a group for arrays. Because there is often greater variation in the spectra for scribe lines, usually these spectra can be excluded from consideration to enhance precision.

Step 1106 can be an alternative to the technique of using multiple reference spectra (described above in step 808 of method 800) to compensate for the above-described errors caused by faulty comparisons. Step 1106 can be performed in lieu of or in addition to step 808.

A subset of the spectra processed thus far is selected (step 1108). The subset consists of the spectra obtained from light reflecting off the substrate at points of a region on the substrate. The region can be, for example, region 512 (FIG. 5).

Optionally, a high-pass filter is applied to the measured raw spectra (step 1110). Application of the high pass filter typically removes low frequency distortion of the average of the subset of spectra. The high-pass filter can be applied to the raw spectra, their average, or to both the raw spectra and their average.

Each spectrum of the subset of spectra is normalized so that its amplitude is the same or similar to the amplitude of a reference spectrum (step 1112). The amplitude of a spectrum is the peak-to-trough value of the spectrum. Alternatively, each spectrum of the subset of spectra is normalized so that its amplitude is the same or similar to a reference amplitude to which the reference spectra have also been normalized.

A difference between each of the normalized spectrum and each reference spectrum is calculated (step 1114). The reference spectra are obtained as described in reference to FIG. 7B. The difference is calculated using the above-described equation for calculating differences between spectra.

A difference trace is updated with the smallest of the calculated differences (step 1116). The difference trace exhibits a calculated differences between normalized spectra and reference spectra as a function of time (or platen revolution).

A median filter and a low-pass filter are applied to the updated difference trace (step 1118). Application of these filters typically smoothes the trace (by reducing or eliminating spikes in the trace).

Endpoint determination is performed based on the updated and filtered difference trace (step 1120). The determination is made based on when the difference trace reaches a minimum. The above described window logic is used to make the determination.

More generally, the signal processing steps of steps 1104-1112 can be used to improve endpoint determination procedures. For example, instead of generation of a difference trace, the normalized spectra could be used to select a spectra from a library to generate an index trace, as described above in reference to FIG. 10A.

Figure 12:
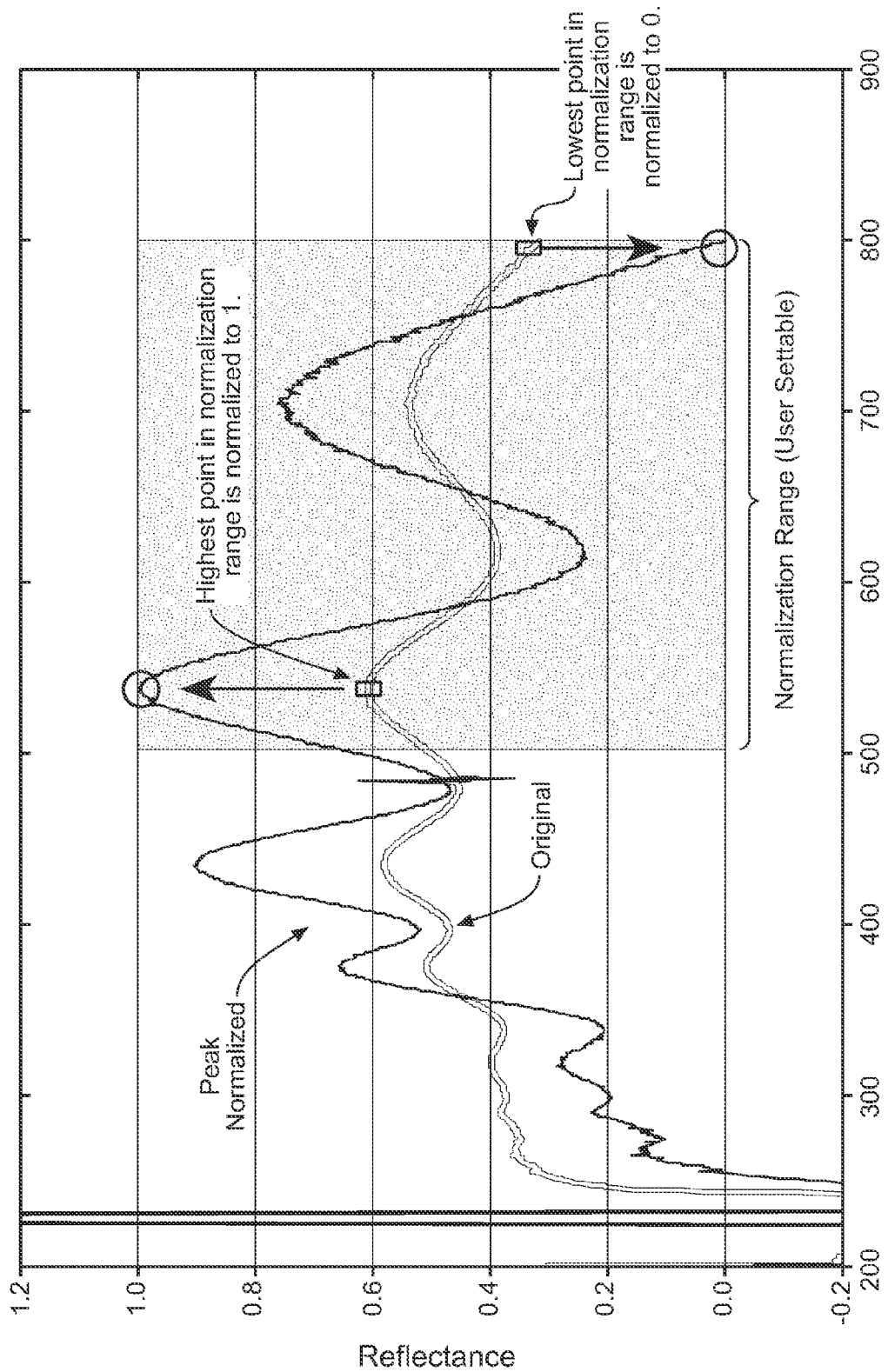
FIG. 12 illustrates peak-to-trough normalization of a spectrum.

FIG. 12 illustrates the normalization of step 1112. As can be seen, only a portion of a spectrum (or an average of spectra) is considered for normalization. The portion considered is referred to in the instant specification as a normalization range and, furthermore, can be user selectable. Normalization is effected so that the highest point and the lowest point in the normalization range are normalized to 1 and 0, respectively. The normalization is calculated as follows:

$$g=(1-0)/(r_{max}-r_{min})$$

$$h=1-r_{max}+g$$

$$N=R+g+h$$

where, g is a gain, h is an offset, $r_{max}$ is the highest value in the normalization range, $r_{min}$ is the lowest value in the normalization range, N is the normalized spectrum, and R is the pre normalized spectrum.

Figure 13:
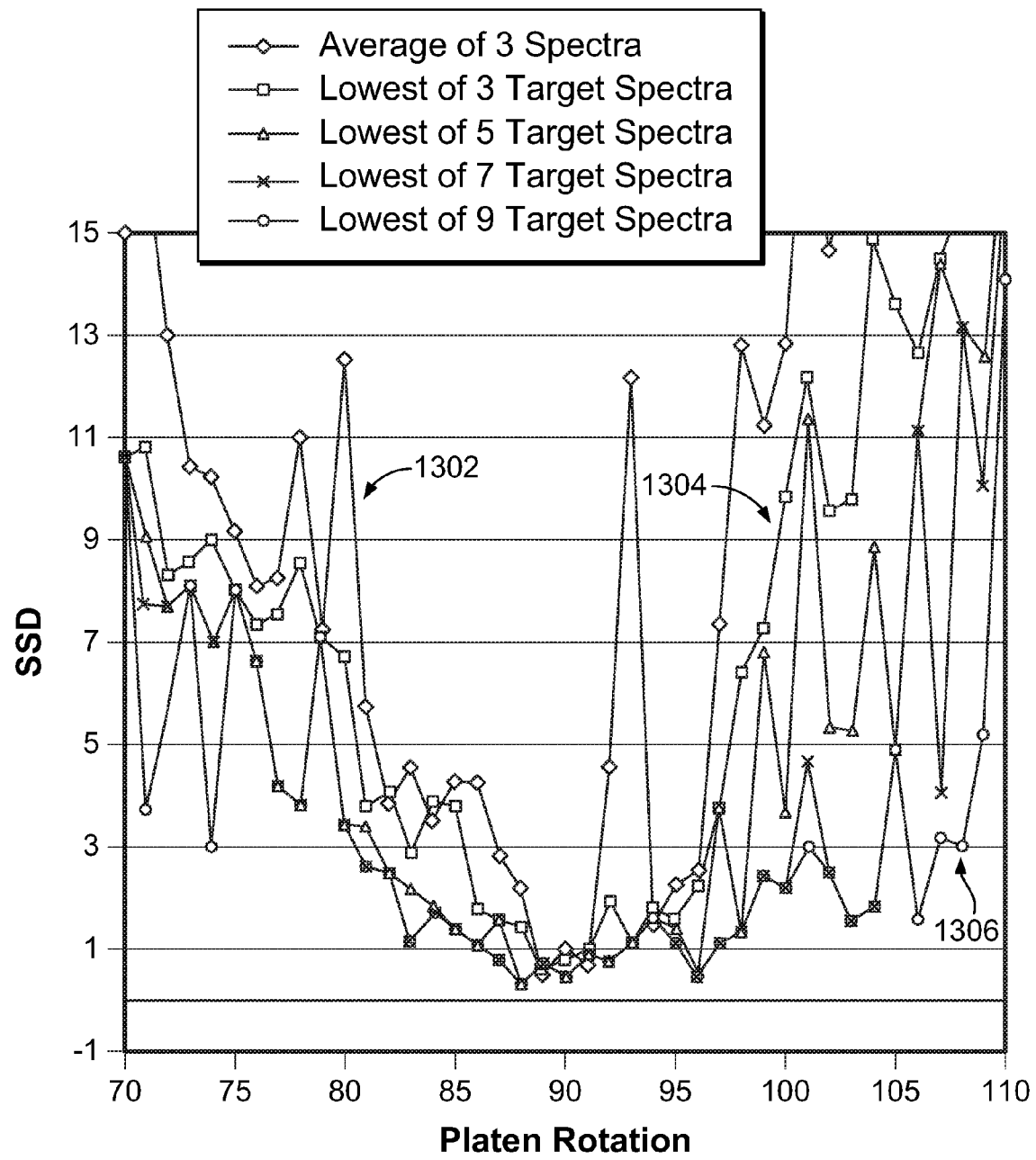
FIG. 13 illustrates the smoothing effect using multiple reference spectra provides.

FIG. 13 illustrates the smoothing effect using multiple reference spectra provides. Trace 1302 was generated using a single reference spectrum (which is an average). Trace 1304 was generated using three reference spectra (as described above in reference to FIG. 8). Trace 1306 was generated using nine reference spectra. As can be seen, trace 1304 includes fewer spikes than does trace 1302. That is, the trace 1304 is smoother than trace 1302. Moreover, trace 1304 has a more defined dip than does trace 1306, which is significant because it is the dip that allows endpoint determination logic to call endpoint. A more defined dip thus facilitates endpoint determination.

Embodiments of the invention and all of the functional operations described in this specification can be implemented in digital electronic circuitry, or in computer software, firmware, or hardware, including the structural means disclosed in this specification and structural equivalents thereof, or in combinations of them. Embodiments of the invention can be implemented as one or more computer program products, i.e., one or more computer programs tangibly embodied in an information carrier, e.g., in a machine-readable storage device or in a propagated signal, for execution by, or to control the operation of, data processing apparatus, e.g., a programmable processor, a computer, or multiple processors or computers. A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

The above described polishing apparatus and methods can be applied in a variety of polishing systems. Either the polishing pad, or the carrier head, or both can move to provide relative motion between the polishing surface and the substrate. For example, the platen may orbit rather than rotate. The polishing pad can be a circular (or some other shape) pad secured to the platen. Some aspects of the endpoint detection system may be applicable to linear polishing systems, e.g., where the polishing pad is a continuous or a reel-to-reel belt that moves linearly. The polishing layer can be a standard (for example, polyurethane with or without fillers) polishing material, a soft material, or a fixed-abrasive material. Terms of relative positioning are used; it should be understood that the polishing surface and substrate can be held in a vertical orientation or some other orientation.

Particular embodiments of the invention have been described. Other embodiments are within the scope of the following claims. For example, the actions recited in the claims can be performed in a different order and still achieve desirable results.

What is claimed is:

1. A computer implemented method of monitoring a polishing process, comprising:
   storing a library having a plurality of reference spectra, each reference spectrum of the plurality of reference spectra representing a spectrum resulting from reflection of white light from a reference substrate;

for each sweep of a plurality of sweeps of an optical sensor across a substrate undergoing polishing, obtaining a plurality of current spectra, each current spectrum of the plurality of current spectra being a spectrum resulting from reflection of white light from the substrate undergoing polishing;

for each sweep of the plurality of sweeps, determining a difference between each current spectrum of the plurality of current spectra obtained in the sweep and each reference spectrum of the plurality of reference spectra from the library to generate a plurality of differences;

for each sweep of the plurality of sweeps, determining a smallest difference of the plurality of differences, thus generating a sequence of smallest differences; and determining a polishing endpoint based on the sequence of smallest differences.

2. The method of claim 1, wherein determining the polishing endpoint comprises detecting that the sequence of smallest differences has reached a threshold value.

3. The method of claim 1, wherein determining the polishing endpoint comprises determining whether the sequence of smallest differences has reached a minimum.

4. The method of claim 1, wherein determining the polishing endpoint comprises detecting whether the sequence of smallest differences has risen to a threshold value above the minimum.

5. The method of claim 3 or 4, wherein determining the polishing endpoint comprises calculating a slope of the sequence of smallest differences.

6. The method of claim 1, further comprising applying a filter to smooth the sequence of smallest differences.

7. The method of claim 1, wherein determining the difference between each current spectrum and each reference spectrum comprises calculating a sum of absolute values of differences in intensities over a range of wavelengths between each current spectrum and each reference spectrum.

8. The method of claim 7, comprising normalizing each current spectrum so that a peak-to-trough amplitude of each current spectrum is the same as or similar to a peak-to-trough amplitude of the reference spectrum.

9. The method of claim 1, wherein obtaining the plurality of current spectra, determining the difference between each current spectrum and each reference spectrum, and determining the smallest difference, are performed for each zone of a plurality of zones on the substrate undergoing polishing for each sweep of the plurality of sweeps.

10. A computer implemented method of monitoring a polishing process, comprising:

storing a library having a plurality of reference spectra, each reference spectrum of the plurality of reference spectra representing a spectrum resulting from reflection of white light from a reference substrate;

for each sweep of a plurality of sweeps of an optical sensor across a substrate undergoing polishing, obtaining a plurality of current spectra, each current spectrum of the plurality of current spectra being a spectrum resulting from reflection of white light from the substrate undergoing polishing;

for each sweep of the plurality of sweeps, determining a difference between each current spectrum of the plurality of current spectra obtained in the sweep and each reference spectrum of the plurality of reference spectra from the library to generate a plurality of differences;

for each sweep of the plurality of sweeps, selecting a best-matching reference spectrum from the plurality of reference spectra, the best-matching reference spectrum having a smallest difference of the plurality of differences, thus generating a sequence of best matching reference spectra; and determining a polishing endpoint based on the sequence of best matching reference spectra.

11. The method of claim 10, comprising determining an index value associated with each best matching reference spectrum of the sequence of best matching reference spectra to generate a sequence of index values.

12. The method of claim 11, wherein determining the polishing endpoint comprises detecting that the sequence of index values has reached a target value.

13. The method of claim 11, further comprising applying a filter to smooth the sequence of index values.

14. The method of claim 10, wherein determining the difference between each current spectrum and each reference spectrum comprises calculating a sum of absolute values of differences in intensities over a range of wavelengths between each current spectrum and each reference spectrum.

15. The method of claim 14, comprising normalizing each current spectrum so that a peak-to-trough amplitude of each current spectrum is the same as or similar to a peak-to-trough amplitude of the reference spectrum.

16. The method of claim 10, wherein each reference spectrum of the plurality of reference spectra is associated with a unique index value.

17. The method of claim 10, wherein obtaining the plurality of current spectra, determining the difference between each current spectrum and each reference spectrum, and selecting the best-matching reference spectrum determining a smallest difference, are performed for each zone of a plurality of zones on the substrate undergoing polishing for each sweep of the plurality of sweeps.

* * * * *